(12) United States Patent
Chen et al.

(10) Patent No.: US 10,340,250 B2
(45) Date of Patent: Jul. 2, 2019

(54) STACK TYPE SENSOR PACKAGE STRUCTURE

(71) Applicant: KINGPAK TECHNOLOGY INC., Hsin-Chu County (TW)

(72) Inventors: Jian-Ru Chen, Hsin-Chu County (TW); Jo-Wei Yang, Hsin-Chu County (TW); Li-Chun Hung, Hsin-Chu County (TW); Hsiu-Wen Tu, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 15/911,574

(22) Filed: Mar. 5, 2018

(65) Prior Publication Data

US 2019/0057952 A1  Feb. 21, 2019

Related U.S. Application Data

(60) Provisional application No. 62/545,542, filed on Aug. 15, 2017.

(30) Foreign Application Priority Data

Oct. 27, 2017 (CN) .......................... 2017 1 1020975

(51) Int. Cl.
*B81B 7/00* (2006.01)
*B81C 3/00* (2006.01)
(Continued)

(52) U.S. Cl.
CPC ............ *H01L 24/85* (2013.01); *B81B 7/0009* (2013.01); *B81B 7/0032* (2013.01); *B81B 7/02* (2013.01);
(Continued)

(58) Field of Classification Search
CPC .... H04N 5/2254; H04N 5/2253; H04N 5/379; H01L 2225/06575; H01L 25/0657;
(Continued)

(56) References Cited

U.S. PATENT DOCUMENTS 7,576,401 B1* 8/2009 de Guzman ........... G02B 7/021
257/234
2002/0096753 A1* 7/2002 Tu ..................... H01L 27/14618
257/680

(Continued)

FOREIGN PATENT DOCUMENTS

JP          2002353427 A    12/2002

OTHER PUBLICATIONS

European Patent Office, The extended European Search Report of EP18161162.5 dated Oct. 11, 2018.

*Primary Examiner* — Charles D Garber
*Assistant Examiner* — Alia Sabur
(74) *Attorney, Agent, or Firm* — Li & Cai Intellectual Property (USA) Office

(57) ABSTRACT

A stack type sensor package structure includes a substrate, a semiconductor chip disposed on the substrate, a frame disposed on the substrate and aside the semiconductor chip, a sensor chip disposed on the frame, a plurality of wires electrically connecting the sensor chip and the substrate, a transparent layer being of its position corresponding to the sensor chip, a support maintaining the relative position between the sensor chip and the transparent layer, and a package compound disposed on the substrate and partially covering the frame, the support, and the transparent layer. Thus, through disposing a frame within the stack type sensor package structure, the structural strength of the overall sensor package structure is reinforced, and the stability of the wiring of the sensor chip is effectively increased.

22 Claims, 22 Drawing Sheets

(51) Int. Cl.
*H04N 5/225* (2006.01)
*B81B 7/02* (2006.01)
*H01L 23/00* (2006.01)
*H01L 27/146* (2006.01)

(52) U.S. Cl.
CPC .............. *B81C 3/001* (2013.01); *H01L 24/17* (2013.01); *H01L 24/24* (2013.01); *H01L 24/30* (2013.01); *H01L 24/46* (2013.01); *H01L 27/14634* (2013.01); *H01L 27/14636* (2013.01); *H04N 5/2253* (2013.01); *H01L 2224/16225* (2013.01); *H01L 2224/32147* (2013.01); *H01L 2224/32225* (2013.01); *H01L 2224/48091* (2013.01); *H01L 2224/48177* (2013.01); *H01L 2224/48227* (2013.01); *H01L 2924/15311* (2013.01); *H01L 2924/181* (2013.01)

(58) Field of Classification Search
CPC ..... H01L 27/14618; H01L 25/00–0657; H01L 31/0203
See application file for complete search history.

(56) References Cited

U.S. PATENT DOCUMENTS

| | | | |
|---|---|---|---|
| 2004/0183180 A1* | 9/2004 | Chung | H01L 23/3128 257/686 |
| 2007/0023873 A1* | 2/2007 | Park | H01L 23/24 257/666 |
| 2007/0241433 A1* | 10/2007 | Carberry | H01L 23/4334 257/676 |
| 2008/0029869 A1* | 2/2008 | Kwon | H01L 23/552 257/686 |
| 2008/0267616 A1 | 10/2008 | Kinoshita | |
| 2009/0166784 A1* | 7/2009 | Honda | H01L 27/14618 257/432 |
| 2013/0221470 A1 | 8/2013 | Kinsman et al. | |
| 2015/0011038 A1* | 1/2015 | Huang | H01L 27/14618 438/66 |
| 2017/0345864 A1* | 11/2017 | Kinsman | H01L 21/4853 |

* cited by examiner

STACK TYPE SENSOR PACKAGE STRUCTURE

BACKGROUND OF THE INVENTION

1. Field of the Invention

The disclosure relates to a sensor package structure; in particular, to a stack type sensor package structure.

2. Description of Related Art

While multiple chips are being set up within a conventional sensor package structure, the method of disposing the chips may affect stability of wire bonding and result in various defects in the sensor package structure. For example, when a conventional sensor package structure includes a semiconductor chip of a larger size and a sensor chip of a smaller size, with the sensor chip being adhered on the semiconductor chip, a relatively large force is required for bonding a wire to the periphery of the sensor chip, which however often damages the sensor chip.

SUMMARY OF THE INVENTION

The disclosure provides a stack type sensor package structure to effectively improve the defects potentially caused by conventional sensor package structures.

The disclosure discloses a stack type sensor package structure, which includes a substrate, at least one semiconductor chip, a frame, a sensor chip, a plurality of wires, a transparent layer, a support, and a package compound. The substrate has an upper surface and a lower surface opposite to the upper surface. The substrate includes a plurality of solder pads arranged on the upper surface. The at least one semiconductor chip is mounted on the substrate. The frame is fixed on the upper surface of the substrate and is surrounded by the solder pads. The at least one semiconductor chip is in a space defined by the frame and the substrate and does not contact the frame, and the frame has a bearing plane above the at least one semiconductor chip. The sensor chip has a top surface and a bottom surface opposite to the top surface. The sensor chip includes a plurality of connecting pads arranged on the top surface thereof. A size of the sensor chip is larger than that of the at least one semiconductor chip, and the bottom surface of the sensor chip is fixed on the bearing plane. Each of the wires has a first end and a second end opposite to the first end. The first ends of the wires are respectively connected to the solder pads, and the second ends of the wires are respectively connected to the connecting pads. The transparent layer has a first surface and a second surface opposite to the first surface. The second surface has a central region and a ring-shaped supported region encircling the central region. The support has a ring-shaped structure and is disposed on at least one of the top surface of the sensor chip and the bearing surface of the frame. A top end of the support abuts against the supported region of the transparent layer. The package compound is disposed on the upper surface of the substrate and covers a lateral side of the frame, at least part of a lateral side of the transparent layer, and a lateral side of the support. At least part of each of the wires is embedded in the package compound.

Within the stack type sensor package structure according to one embodiment of the disclosure, the frame is disposed on the substrate so that the structural strength of the stack type sensor package structure can be increased, and the sensor chip can be disposed on the more stable frame, thereby controlling levelness of the sensor chip. Furthermore, because the wire bonding region of the sensor chip is supported by the frame, the wires can be effectively connected to the wire bonding region of the sensor chip during the wire bonding process so as to prevent other components from being damaged.

Moreover, the sensor chip and the semiconductor chip of the stack type sensor package structure are separated from each other by the frame, so the sensor chip is less directly affected by heat energy generated from the semiconductor chip. Heat from the semiconductor chip can be dissipated by conduction through the substrate, thus heat dissipating performance of the stack type sensor package structure is effectively enhanced.

In addition, according to one embodiment of the disclosure, a through hole is formed in the frame. Thus, when the adhesive (not shown in the drawings) between the frame and the substrate is baked, air between the frame and the substrate expands as it is heated and exhausts via the through hole, thereby maintaining levelness of the bearing plane of the frame.

In order to further appreciate the characteristics and technical contents of the disclosure, references are hereunder made to the detailed descriptions and appended drawings in connection with the disclosure. However, the appended drawings are merely shown for exemplary purposes, and should not be construed as restricting the scope of the disclosure.

DETAILED DESCRIPTION OF THE PREFERRED EMBODIMENTS

Reference is made to FIGS. 1 to 20, which illustrate embodiments of the disclosure. References are hereunder made to the detailed descriptions and appended drawings in connection with the disclosure. However, the appended drawings are merely provided for exemplary purposes, and should not be construed as restricting the scope of the disclosure.

First Embodiment

Figure 1:
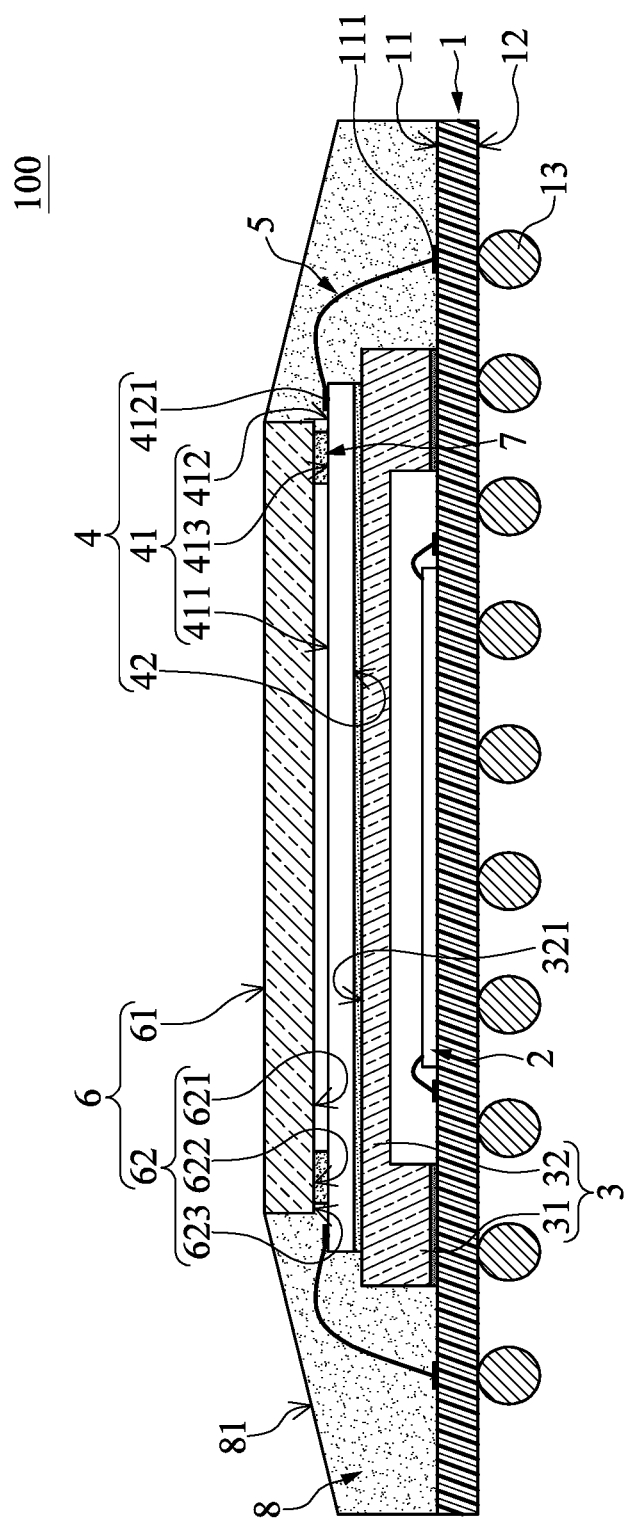
FIG. 1 is a cross-sectional view showing a stack type sensor package structure according to a first embodiment of the disclosure.

As illustrated in FIG. 1, the present embodiment discloses a stack type sensor package structure 100, particularly an image sensor package structure, but the disclosure is not limited thereto. The stack type sensor package structure 100 includes a substrate 1, a semiconductor chip 2 disposed on the substrate 1, a frame 3 disposed on the substrate 1 and arranged outside the semiconductor chip 2, a sensor chip 4 disposed on the frame 3, a plurality of wires 5 electrically connecting the substrate 1 and the sensor chip 4, a transparent layer 6 at a position corresponding to the sensor chip 4, a support 7 configured to maintain the relative position between the transparent layer 6 and the sensor chip 4, and a package compound 8 disposed on the substrate 1 and covering the frame 3, the support 7, and the transparent layer 6. In the following description, the structure of each component of the stack type sensor package structure 100 is elaborated. Interconnections between the components will be described as well.

The substrate 1 in the present embodiment can be a plastic substrate, a ceramic substrate, a lead frame, or other laminated materials, and the disclosure is not limited thereto. The substrate 1 has an upper surface 11 and a lower surface 12 opposite to the upper surface 11. The substrate 1 includes a plurality of solder pads 111 arranged at intervals on the upper surface 11. Furthermore, the substrate 11 also includes a plurality of solder pads (not labeled) arranged on the lower surface 12 to which a plurality of solder balls 13 are respectively connected. In other words, the solder balls 13 are arranged in an array on the lower surface 12 of the substrate 1, and the substrate 1 is exemplified as a ball grid array (BGA) substrate, but the disclosure is not limited thereto.

The semiconductor chip 2 in the present embodiment is mounted on the upper surface 11 of the substrate 1 and is electrically connected to the substrate 1 by wire bonding, but the disclosure is not limited thereto. Moreover, the type of the semiconductor chip 2 can be determined according to design requirements. For example, the semiconductor chip 2 can be a processor chip or a memory chip.

The frame 3 in the present embodiment can be made of glass and is an integrally formed one-piece object. For instance, the frame 3 may be formed by excavating at the center of a bearing board to to create a square well, but the disclosure is not limited hereto. The material of the frame 3 can be a rigid material with high thermal conductivity, such as ceramic or metal. The frame 3 is fixed on the upper surface 11 of the frame 1 and surrounded by the solder pads 111. A space enclosed by the frame 3 and the substrate 1 is filled with air, and the semiconductor chip 2 is in the space and does not contact the frame 3.

Specifically, the frame 3 includes a ring-shaped base 31 and a bearing plate 32 integrally connected to a top end of the ring-shaped base 31, and a bottom end of the ring-shaped base 31 is fixed on the upper surface 11 of the substrate 1. The frame 3 can be fixed to the substrate 1 through an adhesive (not labeled) that attaches the ring-shaped base 31 to the substrate 1, and the adhesive can be a UV curing adhesive, a thermal curing adhesive, an adhesive mixture including an UV curing adhesive and a thermal curing adhesive, or an attach film. However, the disclosure is not limited thereto.

Moreover, an outer surface of the bearing plate 32 (i.e., the top surface of the bearing plate 32 as shown in FIG. 1) is above the semiconductor chip 2 and defined as a bearing plane 321. In other words, in the present embodiment, the outer surface of the bearing plate 32 having better levelness is taken as the bearing plane 321 that sustains the sensor chip 4, thereby ensuring levelness of the sensor chip 4. The frame 3 has high structural rigidity, which effectively mitigates the extent of warpage of the stack type sensor package structure 100.

In addition, the structure of the frame 3 can be adjusted or changed according to design requirements as described in the following embodiments. For example, the frame 3 can be formed with a through hole, which is specifically disclosed in the nineteenth embodiment.

The sensor chip 4 in the present embodiment is an image sensor chip, a size of which is larger than that of the semiconductor chip 2. However, the type of the sensor chip 4 of the disclosure is not limited thereto. The sensor chip 4 has a top surface 41, a bottom surface 42 opposite to the top surface 41, and a lateral side (not labeled) perpendicularly connected to the top surface 41 and the bottom surface 42. The top surface 41 of the sensor chip 4 has a sensing region 411, a wire bonding region 412 arranged on the outer side of the sensing region 411, and a bearing region 413 between the sensing region 411 and the wire bonding region 412. The sensor chip 4 includes a plurality of connecting pads 4121 arranged in the wire bonding region 412 and on the outer side of the sensing region 411.

Specifically, the sensing region 411 in the present embodiment has a roughly rectangular shape (e.g., a square or a rectangle). The center of the sensing region 411 can be aligned with (as shown in FIG. 1) the center of the top surface 41, or spaced apart by a distance from (not shown) the center. The wire bonding region 412 in the present embodiment has a square ring shape, each section of the region 412 is preferably of the same width. However, the specific shape of the wire bonding region 412 can be modified according to actual needs and is not limited thereto. For example, in other embodiments, the wire bonding region 412 can be a strip shape or an L-shape on a side of the sensing region 411, or a pair of strip shapes or an L-shapes on two opposite sides of the sensing region 411.

In another aspect, the bottom surface 42 of the sensor chip 4 is fixed to the bearing plane 321 of the frame 3, and the periphery of the bottom surface 42 of the sensor chip 4 is preferably above the ring-shaped base 31. The bottom surface 42 of the sensor chip 4 in the present embodiment is fixed on the bearing plane 321 of the frame 3 by an adhesive (die attach epoxy, not labeled), but the practical setup method is not limited thereto.

Each of the wires 5 has a first end and a second end opposite to the first end. The first ends of the wires 5 are respectively connected to the solder pads 111 of the substrate 1, and the second ends of the wires 5 are respectively connected to the connecting pads 4121 of the sensor chip 4. Each of the wires 5 can be formed by a reverse or forward bonding process. Specifically, when each of the wires 5 is formed by the reverse bonding process, an angle (not labeled) between the top surface 41 of the sensor chip 4 and a portion of each of the wires 5 adjacent to the top surface 41 is smaller than or equal to 45 degrees so that the apex of each of the wires 5 is at a lower level and thus prevented from touching the transparent layer 6. However, the disclosure is not limited thereto.

The transparent layer 6 in the present embodiment is transparent and exemplified as a glass plate; however the type of the transparent layer 6 is not limited thereto by the disclosure. For example, the transparent layer 6 can be made of a light-transmissive (or transparent) plastic material. The transparent layer 6 has a first surface 61, a second surface 62 opposite to the first surface 61, and a lateral side (not labeled) perpendicularly connected to the first surface 61 and the second surface 62. The first surface 61 and the second surface 62 in the present embodiment are in rectangular shapes (a square or a rectangle) of the same size, and the area of the second surface 62 is smaller than that of the top surface 41 of the sensor chip 4, but the disclosure is not limited thereto.

Furthermore, the transparent layer 6 is disposed above the sensor chip 4 by using the support 7, and the second surface 62 of the transparent layer 6 is substantially parallel to and faces the top surface 41 of the sensor chip 4. Moreover, the second surface 62 has a central region 621 facing the sensor chip 4, a ring-shaped supported region 622 enclosing the central region 621, and a ring-shaped fixed region 623 surrounding the supported region 622. The central region 621 of the second surface 62 aligns with the area the sensing region 411 of the sensor chip 4 orthogonally projects onto the second surface 62, but the disclosure is not limited thereto. The portion of the second surface 62 abutting upon the support 7 is just the supported region 622. The rest of the second surface 62 other than the central region 621 and the supported region 622 is just the fixed region 623.

In addition, the second surface 62 of the transparent layer 6 is preferably arranged close to each of the wires 5 but does not contact any one of the wires 5. A height of the apex of each wire 5 relative to the upper surface 11 of the substrate 1 is preferably smaller than a height of the second surface 62 of the transparent layer 6 relative to the upper surface 11 of the substrate 1, but the disclosure is not limited thereto.

The support 7 has a ring shape and is made of a glass mount epoxy (GME), but the disclosure is not limited thereto. A bottom end of the support 7 is disposed on the bearing region 413 of the top surface 41 of the sensor chip 4, and is located between the sensing region 411 and the connecting pads 4121. A top end of the support 7 abuts against the supported region 622 of the transparent layer 6. The support 7 neither contacts the central region 621 nor the fixed region 623. Accordingly, by means of the support 7 in the stack type sensor package structure 100, the second surface 62 of the transparent layer 6 is kept substantially parallel to and at a predetermined distance from the top surface 41 of the sensor chip 4.

The package compound 8 in the embodiment is a liquid compound, but the disclosure is not limited thereto. The package compound 8 is disposed on the upper surface 11 of the substrate 1 and covers the lateral side of the support 7, the lateral side and a part of the bearing plane 321 of the frame 3, the lateral side and the wire bonding region 412 of the sensor chip 4, and the lateral side and the fixed region 623 of the transparent layer 6. Moreover, the top surface 81 of the package compound 8 is an oblique surface or a curved surface, and an edge of the top surface 81 is connected to an edge of the transparent layer 6 (e.g., the edge of the first surface 61) so as to form an acute angle between the top surface 81 of the package compound 8 and the first surface 61 of the transparent layer 6. However, the disclosure is not limited thereto. In addition, each of the wires 5 and each of the solder pads 111 are embedded in the package compound 8.

As mentioned above, in the stack type sensor package structure 100 disclosed by the embodiment, the frame 3 is disposed on the substrate 1 so that the overall structural strength of the package structure is increased, and the sensor chip 4 can be disposed on the more stable frame 4 to thereby control levelness of the sensor chip 4. Furthermore, the wire bonding region 412 of the sensor chip 4 is solidly supported by the frame 3, thus the wires 5 can be effectively connected to the wire bonding region 412 of the sensor chip 4 during the wire bonding process, which avoids damaging other components.

In addition, the sensor chip 4 and the semiconductor chip 2 of the stack type sensor package structure 100 are separated from each other by the frame 3, the sensor chip 4 is less directly affected by heat generated from the semiconductor chip 2. Also, heat generated by the semiconductor chip 2 yet can dissipate through the substrate 1 and the solder balls 13, which effectively increases heat dissipating performance of the stack type sensor package structure 100.

Second Embodiment

Figure 2:
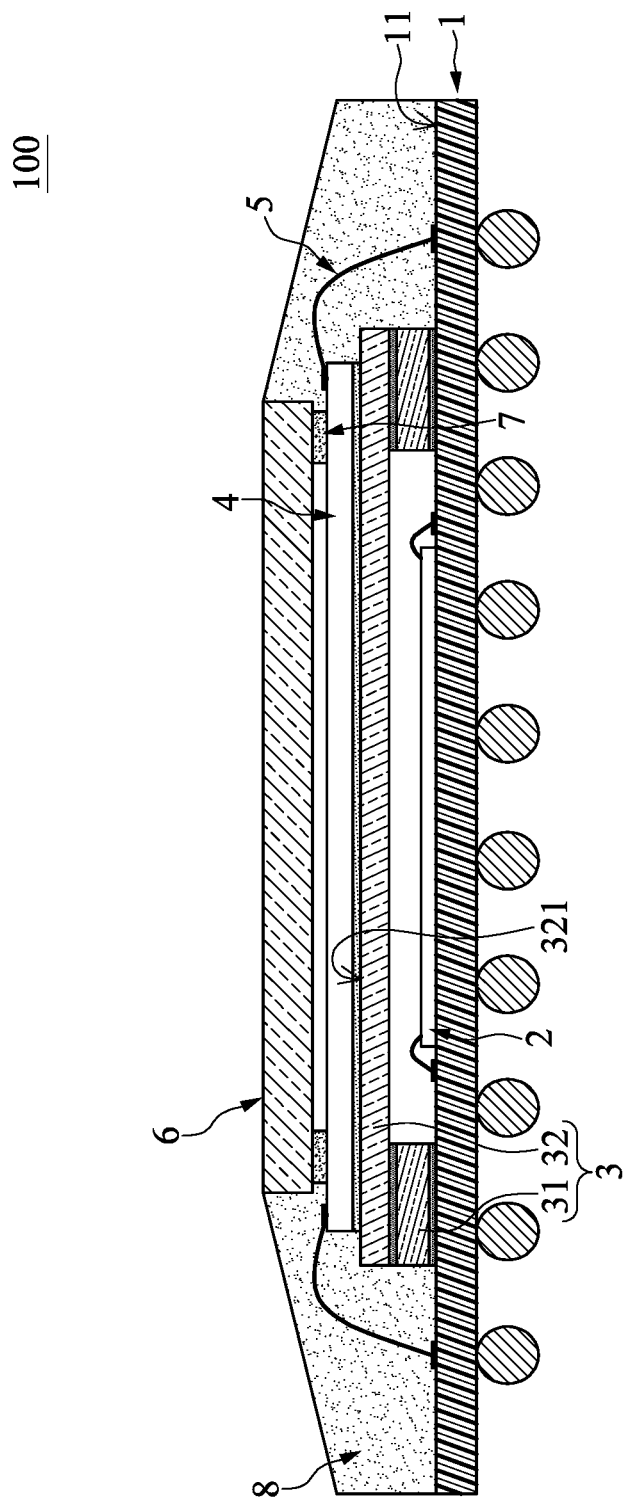
FIG. 2 is a cross-sectional view showing the stack type sensor package structure according to a second embodiment of the disclosure.

Reference is made to FIG. 2, which illustrates a second embodiment of the disclosure. The second embodiment is similar to the first embodiment. The common ground between the embodiments shall not be recited again. However, the major difference between the embodiments is in the structure of the frame 3, which is elaborated as follows.

In the present embodiment, the ring-shaped base 31 of the frame 3 is not integrally formed with the bearing plate 32 of the frame 3. For example, the ring-shaped base 31 is connected to a peripheral portion of the bearing plate 32 by an adhesive (not labeled), and the lateral side of the ring-shaped base 31 is flush with the lateral side of the bearing plate 32. The adhesive can be a UV curing adhesive, a thermal curing adhesive, an adhesive mixture including a UV curing adhesive and a thermal curing adhesive, or an attach film. However, the disclosure is not limited thereto.

Specifically, since the ring-shaped base 31 is not integrally formed with the bearing plate 32, the material of the ring-shaped base 31 can be the same as or different from that of the bearing plate 32. The ring-shaped base 31 or the bearing plate 32 may be made of a rigid material having a coefficient of thermal expansion (CTE) smaller than 10 ppm/° C., e.g., a glass material having a CTE of 7.2 ppm/° C., a silicon material having a CTE of 2.6 ppm/° C., a metallic material, or a ceramic material.

Third Embodiment

Figure 3:
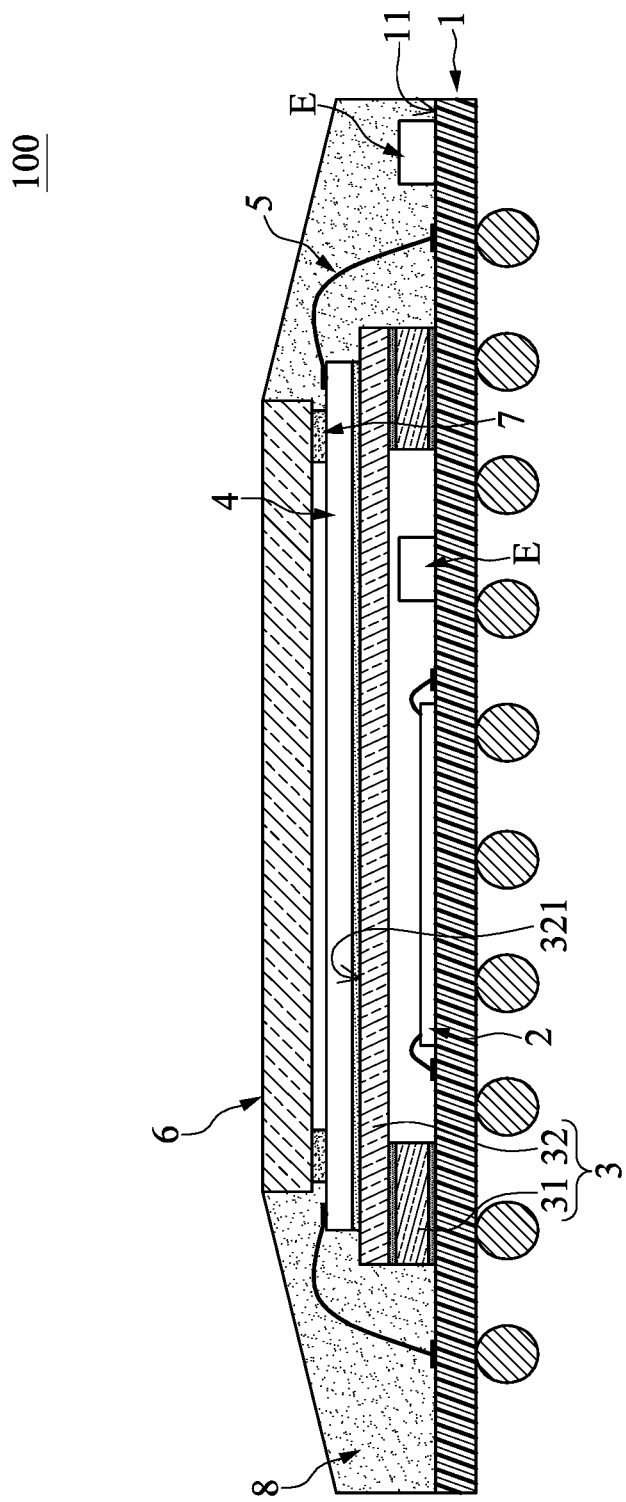
FIG. 3 is a cross-sectional view showing the stack type sensor package structure according to a third embodiment of the disclosure.

Reference is made to FIG. 3, which illustrates a third embodiment of the disclosure. The third embodiment is similar to the second embodiment. The common ground between the embodiments shall not be recited again. However, the difference between the embodiments is that the stack type sensor package structure 100 of the present embodiment further includes a plurality of passive electronic components E, and the difference is described as follows.

In the present embodiment, the passive electronic components E are mounted on the upper surface 11 of the substrate 1, and some of the passive electronic components E are disposed apart from the semiconductor chip 2 within the space enclosed by the substrate 1 and the frame 3, and the rest of the passive electronic components E are arranged outside the frame 3 and embedded in the package compound 8.

Fourth Embodiment

Figure 4:
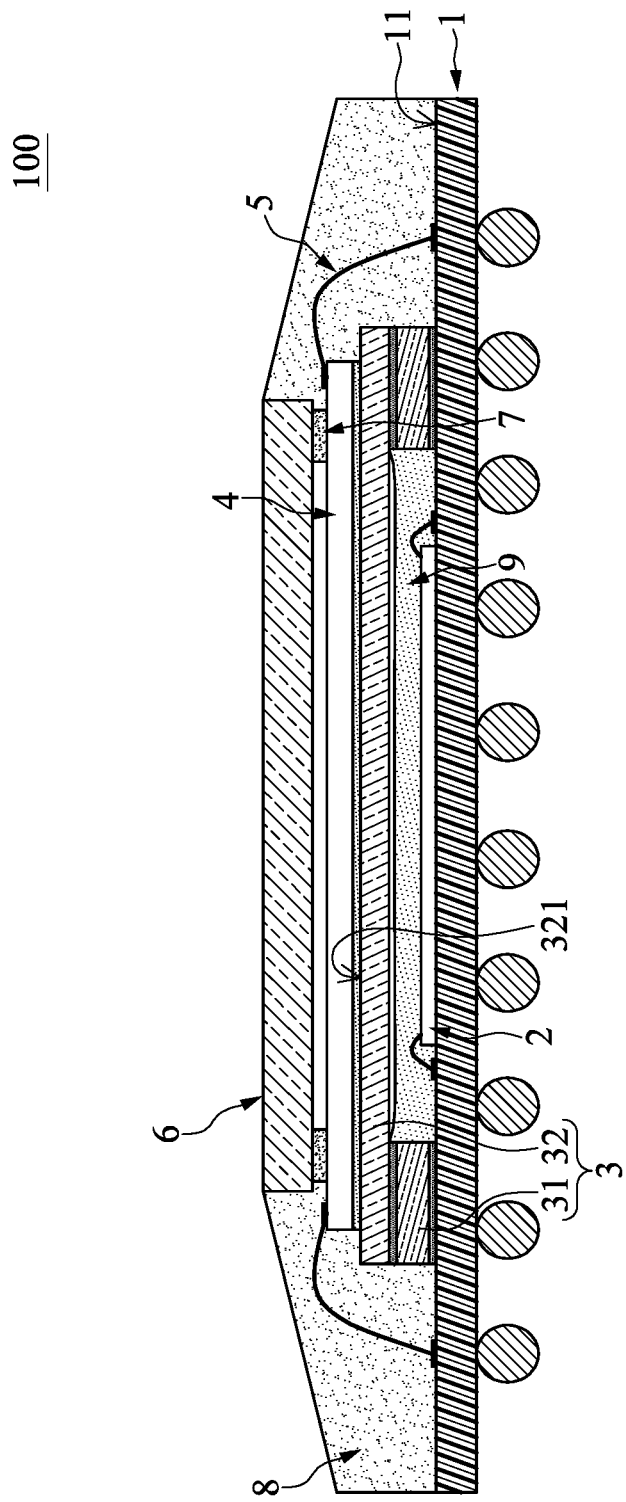
FIG. 4 is a cross-sectional view showing the stack type sensor package structure according to a fourth embodiment of the disclosure.

Reference is made to FIG. 4, which illustrates a fourth embodiment of the disclosure, similar to the second embodiment. The common ground between the embodiments shall not be recited again. However, the difference between the present embodiment and the second embodiment is that the stack type sensor package structure 100 of the present embodiment further includes a sealant 9, and the difference is recited as follows.

In the present embodiment, the space enclosed by the frame 3 and the substrate 1 is partially filled with the sealant 9, and the semiconductor chip 2 is embedded in the sealant 9. Moreover, when the ring-shaped base 31 is fixed on the upper surface 11 of the substrate 1 and is not connected to the bearing plate 32, the sealant 9 can fill the ring-shaped base 31 to embed the semiconductor chip 2 therein, and then the bearing plate 32 is fixed on the top end of the ring-shaped base 31.

Fifth Embodiment

Figure 5A:
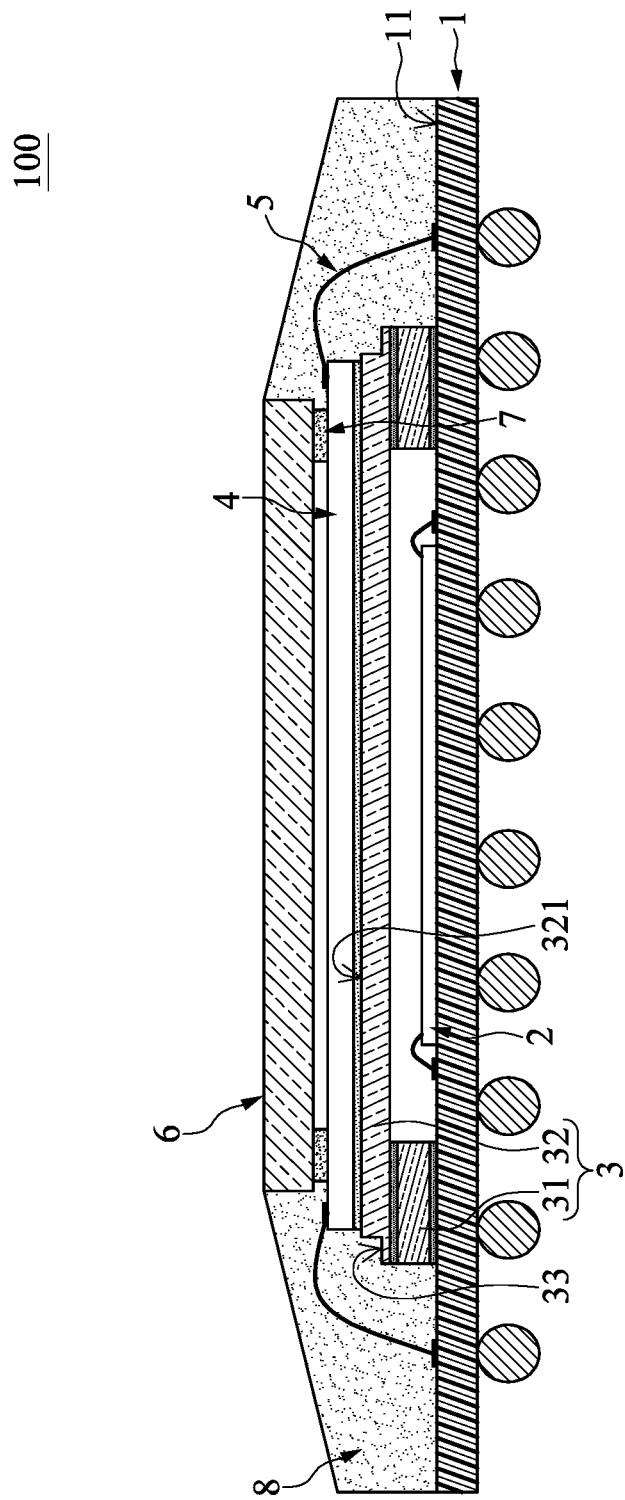
FIG. 5A is a cross-sectional view showing the stack type sensor package structure according to a fifth embodiment of the disclosure.
Figure 5B:
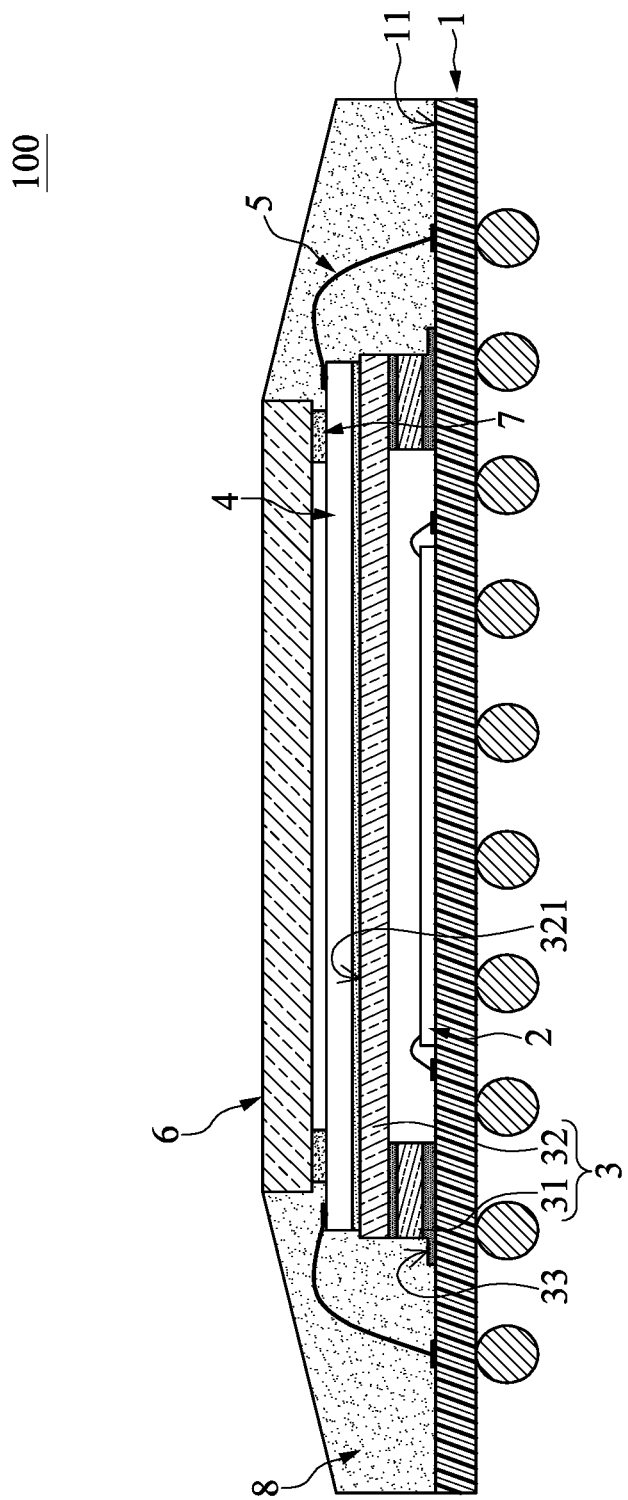
FIG. 5B is a cross-sectional view showing the stack type sensor package structure in another configuration according to the fifth embodiment of the disclosure.

Reference is made to FIGS. 5A and 5B, which illustrate a fifth embodiment of the disclosure, similar to the second embodiment. The description of the common ground between the two embodiments is skipped. The difference between the present embodiment and the second embodiment is in the structure of the frame 3, and the difference is described as follows.

In the present embodiment, the frame 3 is recessed at an edge of the bearing plane 231 to form a ring-shaped notch 33, and the ring-shaped notch 33 is outside the sensor chip 4. The depth of the notch 33 relative to the bearing plane 321 can be adjusted according to design requirements. For example, the notch 33 can be formed to extend into the bearing plate 32 only (as shown in FIG. 5A), or the notch 33 may be formed to further extend into the ring-shaped base 31 through the bearing plate 32 (as shown in FIG. 5B).

Sixth Embodiment

Figure 6:
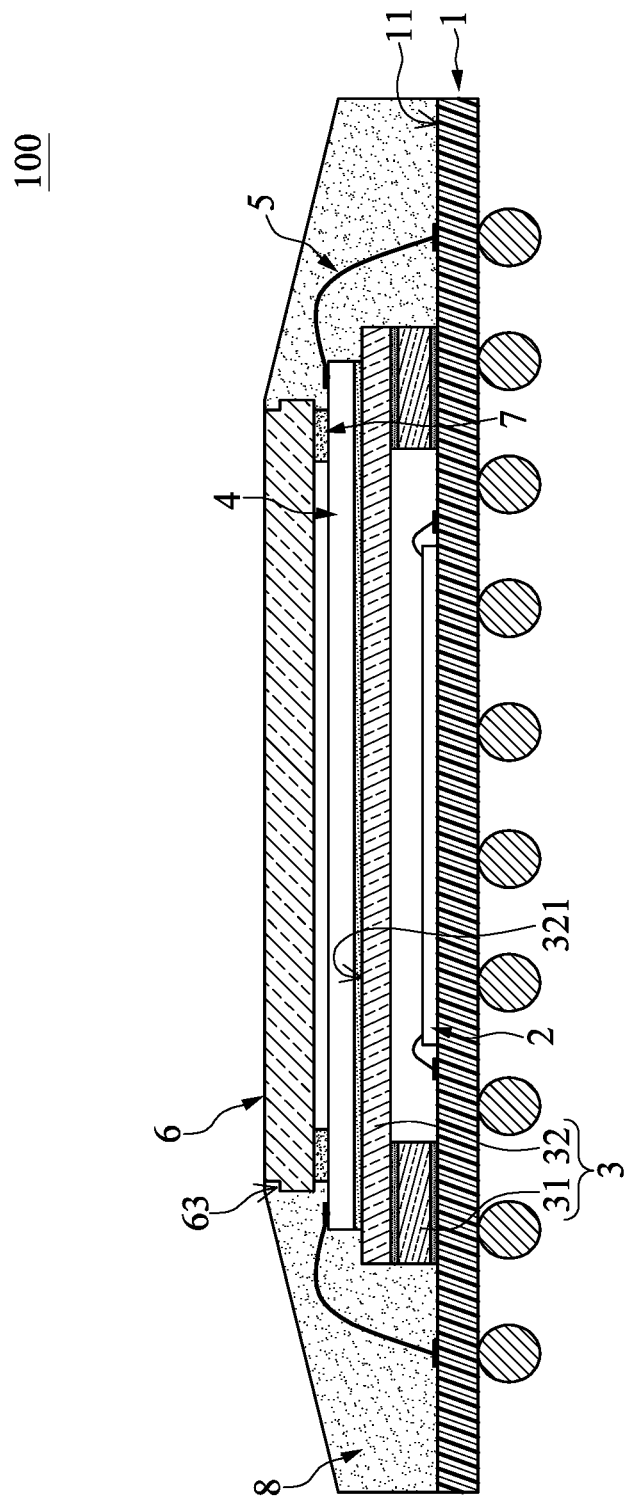
FIG. 6 is a cross-sectional view showing the stack type sensor package structure according to a sixth embodiment of the disclosure.

Reference is made to FIG. 6 illustrating a sixth embodiment of the disclosure similar to the second embodiment. The difference between the present embodiment and the second embodiment is in the structure of the transparent layer 6, which is described as follows.

In the present embodiment, the periphery of the top portion of the transparent layer 6 is formed with has a step portion 63 for the package compound 8 to be attached thereto. The specific structure of the step portion 63 can vary according to design requirements. For example, the step portion 63 can be a ring shape, an L shape, or an elongated strip shape.

Seventh Embodiment

Figure 7:
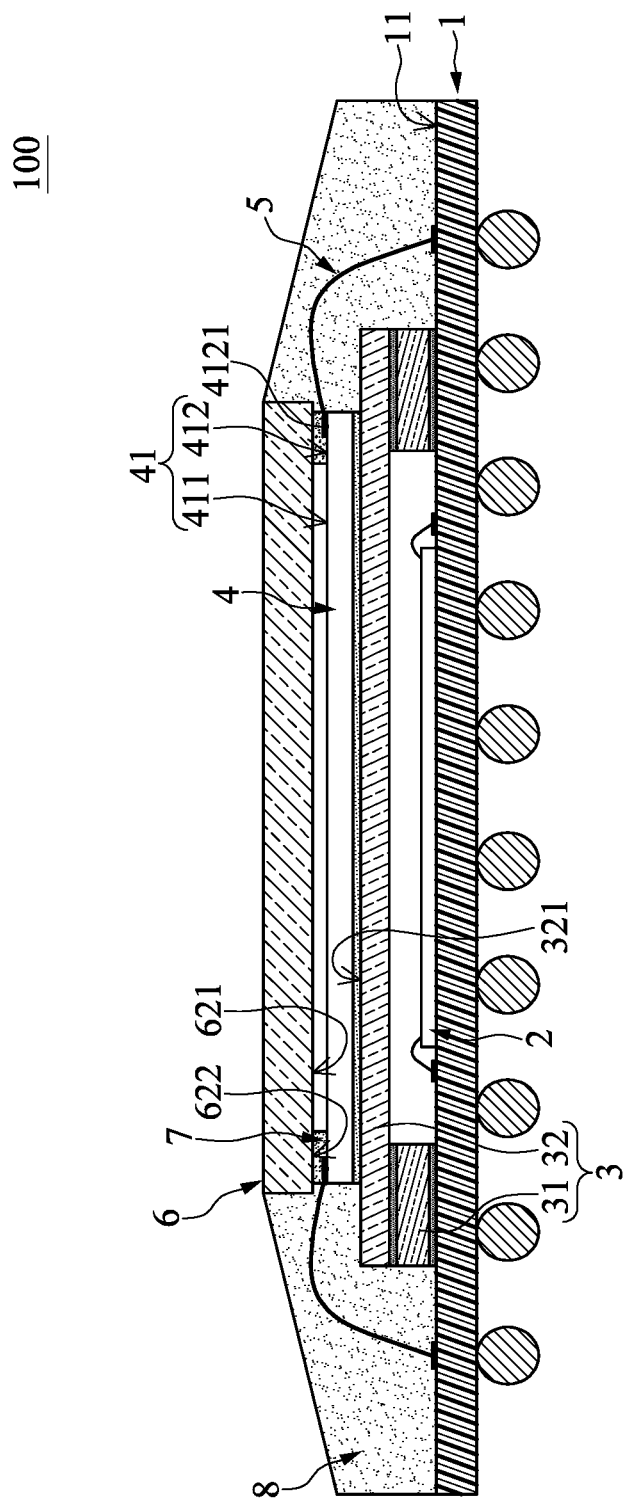
FIG. 7 is a cross-sectional view showing the stack type sensor package structure according to a seventh embodiment of the disclosure.

FIG. 7 illustrates a seventh embodiment of the disclosure, similar to the second embodiment. The difference between the present embodiment and the second embodiment is in the structure of the support 7, as follows.

In the present embodiment, the top end of the support 7 abuts against the supported region 622 of the transparent layer 6, and the bottom end of the support 7 is disposed on the wire bonding region 412 of the top surface 41 of the sensor chip 4. The connecting pads 4121 and a part of each of the wires 5 are embedded in the support 7, and the rest part of each of the wires 5 is embedded in the package compound 8. From another perspective the top surface 41 of the sensor chip 4 only includes the sensing region 411 and the wire bonding region 412 surrounding the sensing region 411, but does not include the bearing region 413. In other words, the top surface of the sensor chip 4 may be deemed that the wire bonding region 412 coincides with the bearing region 413.

Eighth Embodiment

Figure 8:
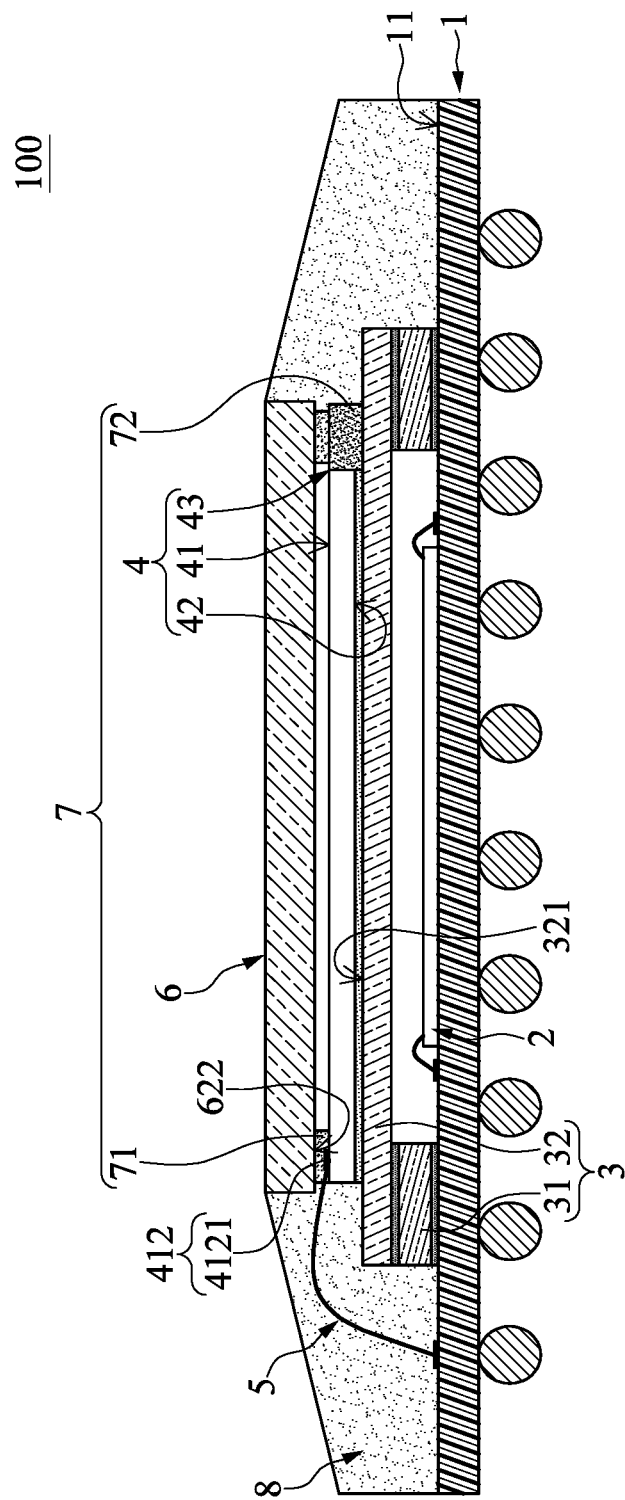
FIG. 8 is a cross-sectional view showing the stack type sensor package structure according to an eighth embodiment of the disclosure.

FIG. 8 illustrates an eighth embodiment of the disclosure, similar to the seventh embodiment. The difference between the present embodiment and the seventh embodiment is in the structure of the support 7, as follows.

In the present embodiment, the top end of the support 7 abuts against the supported region 622 of the transparent layer 6, a part of the bottom end of the support 7 is disposed on the top surface 41 of the sensor chip 4 and encompasses the connecting pads 4121 and a part of each of the wires 5, and the rest part of each of the wires 5 is embedded in the package compound 8.

Specifically, no connecting pad 4121 is disposed on an edge portion 43 of the sensor chip 4 (i.e., the right edge portion of the sensor chip 4 in FIG. 8). The support 7 includes a first supporting portion 71 and a second supporting portion 72. The top end of the first supporting portion 71 abuts against the supported region 622 of the transparent layer 6, and the bottom end of the first supporting portion 71 is disposed on the wire bonding region 412 of the top surface 41 of the sensor chip 4 and encompasses the connecting pads 4121 and the part of each of the wires 5. The top end of the second supporting portion 72 abuts against the supported region 622 of the transparent layer 6, the bottom end of the second supporting portion 72 is disposed on the bearing plane 321 and adjacent to the edge portion 43, and the second supporting portion 72 does not contact any one of the wires 5.

Moreover, the second supporting portion 72 in the present embodiment is described as a two layer structure formed with mutually stacked layers, but the disclosure is not limited thereto. For example, in other embodiments, the second supporting portion 72 can be an integrally formed one-piece structure.

Furthermore, the first supporting portion 71 and the second supporting portion 72 together can be an integral structure. For example, the bottom layer structure of the second supporting portion 72 is formed first, and the first supporting portion 71 and the upper layer of the second supporting portion 72, which connect with each other and both have a ring shape, are then formed. Wherein, the upper layer of the second supporting portion 72 is stacked on the lower layer of the second supporting portion 72. Or, the first supporting portion 71 and the second supporting portion 72 may be two separately formed components.

In addition, although in the present embodiment, the sensor chip 4 is exemplified as not having any connecting pad 4121 disposed on an edge portion 43 of the sensor chip 4, and the second supporting portion 72 is disposed with its position corresponding to the edge portion 43, the disclosure is not limited thereto. For example, in other embodiments, the sensor chip 4 may include at least two edge portions 43 on which there is no connecting pad 4121 disposed.

Ninth Embodiment

Figure 9:
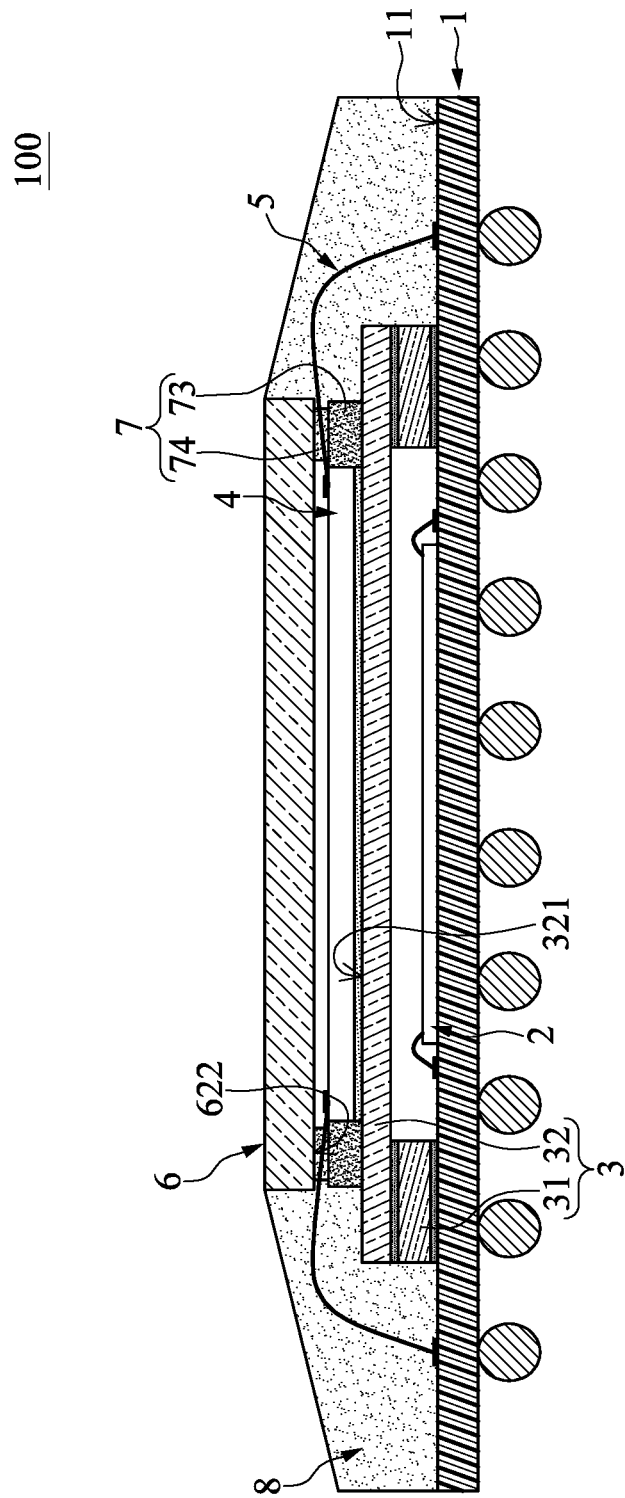
FIG. 9 is a cross-sectional view showing the stack type sensor package structure according to a ninth embodiment of the disclosure.

FIG. 9 illustrates a ninth embodiment of the disclosure, similar to the eighth embodiment. The difference between the present embodiment and the eighth embodiment is in the structure of the support 7, as follows.

In the present embodiment, the support 7 is disposed on the bearing plane 321 of the frame 3 and adjacent to the lateral side of the sensor chip 4. A part of each of the wires 5 is embedded in the support 7, and the other part of each of the wires 5 is embedded in the package compound 8. Specifically, the support 7 includes a supporting layer 73 and a connecting layer 74. The supporting layer 73 is disposed on the bearing plane 321 of the frame 3 and adjacent to the lateral side of the sensor chip 4, and the supporting layer 73 does not contact any one of the wires 5. The connecting layer 74 is disposed on the supporting layer 73, a top end of the connecting layer 74 abuts against the supported region 622 of the transparent layer 6, and a part of each of the wires 5 is embedded in the connecting layer 74. A height of the supporting layer 73 relative to the bearing plane 321 is substantially equal to a height of the sensor chip 4 relative to the bearing plane 321. However, the disclosure is not limited thereto.

In addition, the supporting layer 73 and the connecting layer 74 of the support 7 in the present embodiment are two independent components, but the disclosure is not limited thereto. For example, in other embodiments, the supporting layer 73 and the connecting layer 74 together may be an integrally formed one-piece structure.

Moreover, the supporting layer 73 of the support 7 in the present embodiment is connected to the lateral side of the sensor chip 4, but in other embodiments, a gap can be formed between the support 7 and the lateral side of the sensor chip 4.

Tenth Embodiment

Figure 10:
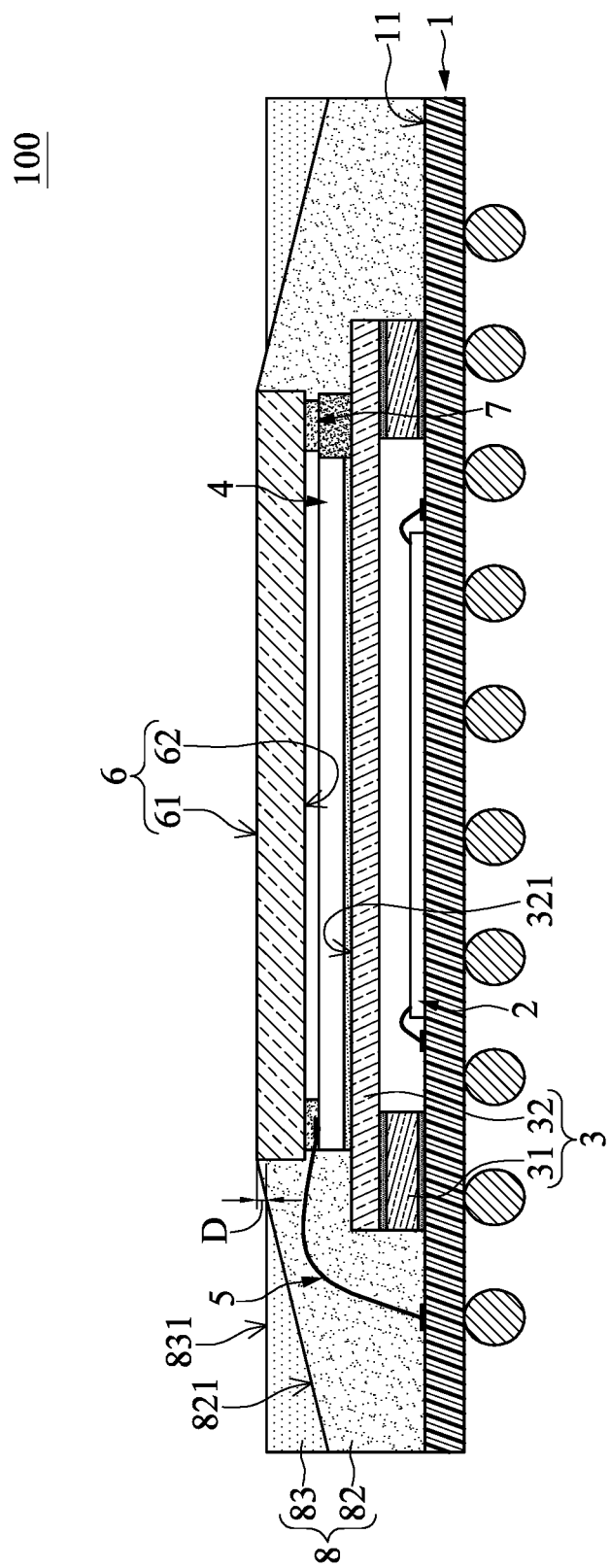
FIG. 10 is a cross-sectional view showing the stack type sensor package structure according to a tenth embodiment of the disclosure.

FIG. 10 illustrates a tenth embodiment of the disclosure, similar to the eighth embodiment. The difference between the present embodiment and the eighth embodiment is in the structure of the package compound 8, as follows.

In the present embodiment, the package compound 8 includes a liquid compound 82 and a molding compound 83. The package compound 8 has been recited in the above embodiments and shall not be described here again. Moreover, the molding compound 83 is formed on the top surface 821 of the liquid compound 82, and a top surface 831 of the molding compound 83 is parallel to the first surface 61 of the transparent layer 6. The top surface 831 of the molding compound 83 is lower than the first surface 61 of the transparent layer 6 by an overflow preventing distance D which is about 50 μm to 100 μm.

Eleventh Embodiment

Figure 11:
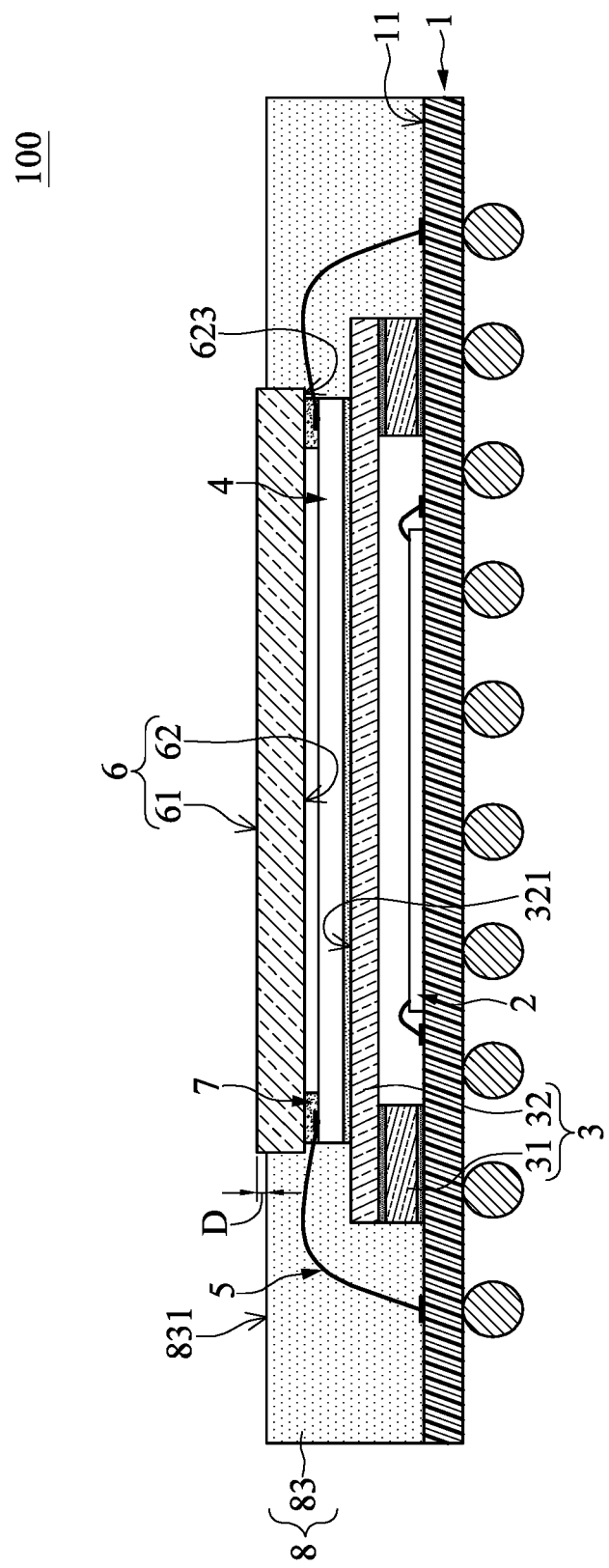
FIG. 11 is a cross-sectional view showing the stack type sensor package structure according to an eleventh embodiment of the disclosure.

FIG. 11 illustrates an eleventh embodiment of the disclosure, similar to the seventh embodiment. The difference between the present embodiment and the seventh embodiment is in the structure of the package compound 8, as follows.

In the present embodiment, the package compound 8 is a molding compound 83 disposed on the upper surface 11 of the substrate 1, and covers the lateral side of the support 7, the lateral side of the frame 3 and a part of the bearing plane 321 thereof, the lateral side of the sensor chip 4, and the fixed region 623 and a part of the lateral side of the transparent layer 6. Moreover, a top surface 831 of the package compound 8 (i.e., the molding compound 83) is planar and lower than the first surface 61 of the transparent layer 6 by an overflow preventing distance D which is about 50 μm to 100 μm.

Twelfth Embodiment

Figure 12:
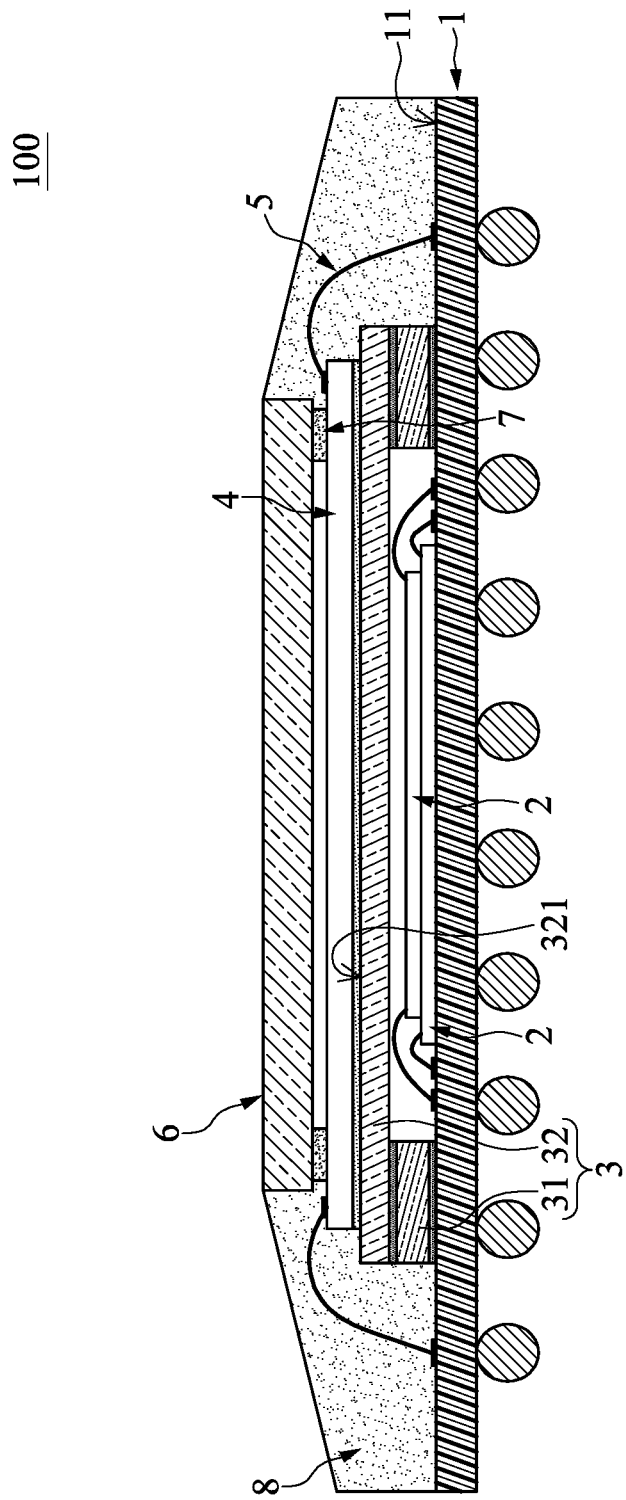
FIG. 12 is a cross-sectional view showing the stack type sensor package structure according to a twelfth embodiment of the disclosure.

FIG. 12 illustrates a twelfth embodiment of the disclosure, similar to the second embodiment. The difference between the present embodiment and the second embodiment is that the stack type sensor package structure 100 of the present embodiment includes a plurality of semiconductor chips 2, as follows.

In the present embodiment, the semiconductor chips 2 are sequentially stacked on the upper surface 11 of the substrate 1, and each of the semiconductor chips 2 is connected to the upper surface 11 of the substrate 1 by wire bonding, thereby establishing an electrical connection between each of the semiconductor chips 2 and the substrate 1.

Thirteenth Embodiment

Figure 13:
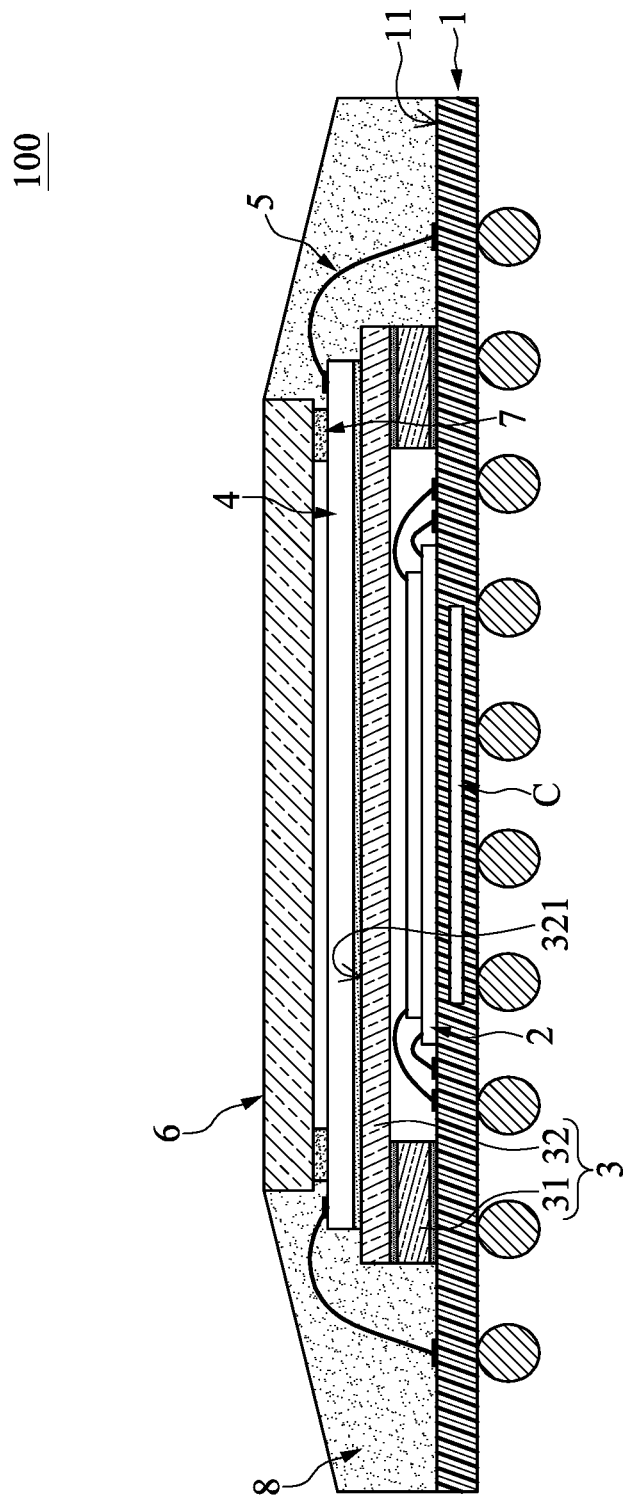
FIG. 13 is a cross-sectional view showing the stack type sensor package structure according to a thirteenth embodiment of the disclosure.

FIG. 13 illustrates a thirteenth embodiment of the disclosure, similar to the twelfth embodiment. The difference between the present embodiment and the twelfth embodiment is that the stack type sensor package structure 100 of the present embodiment further includes an embedded chip C, as follows.

In the present embodiment, the embedded chip C is embedded in the substrate 1. In other embodiments, the stack type sensor package structure 100 may include a plurality of embedded chips C embedded in the substrate 1.

Fourteenth Embodiment

Figure 14A:
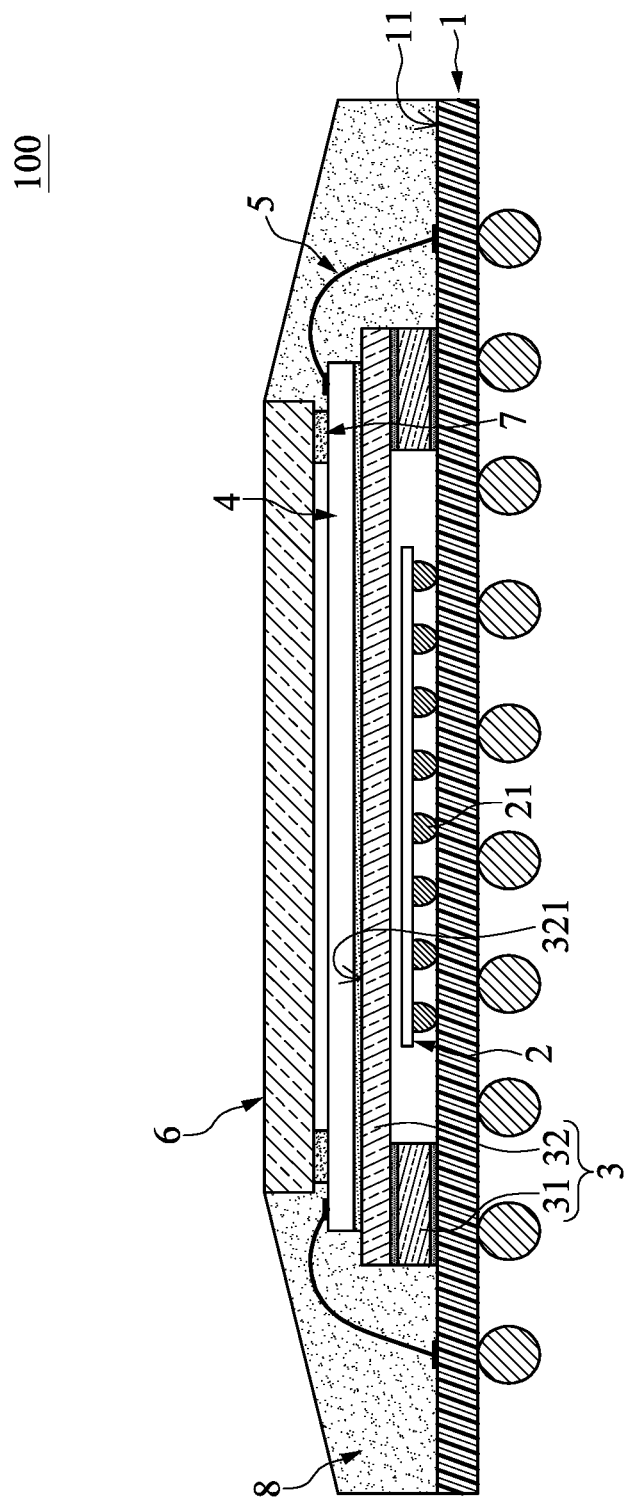
FIG. 14A is a cross-sectional view showing the stack type sensor package structure according to a fourteenth embodiment of the disclosure.
Figure 14B:
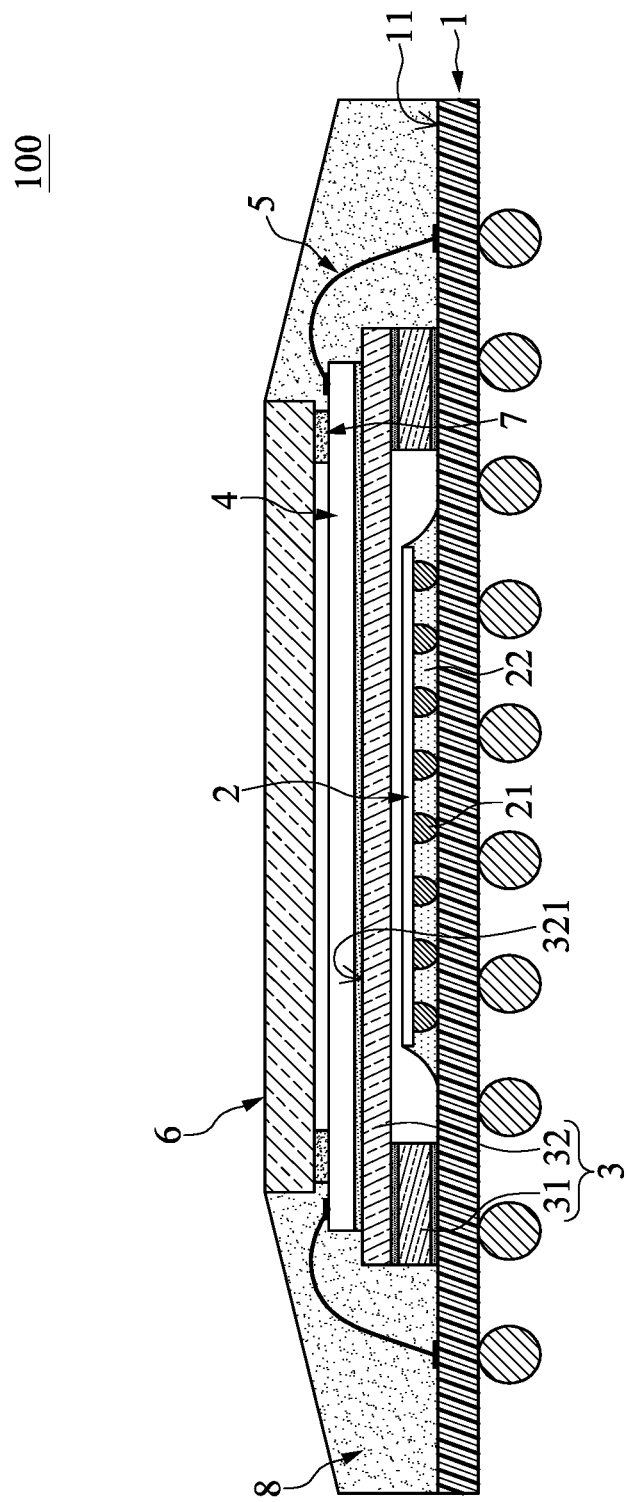
FIG. 14B is a cross-sectional view showing the stack type sensor package structure in another configuration according to a fourteenth embodiment of the disclosure.

FIGS. 14A and 14B illustrate a fourteenth embodiment of the disclosure, similar to the seventh embodiment. The difference between the present embodiment and the seventh embodiment is the way the semiconductor chip 2 is bonded to the substrate 1, as follows.

In the present embodiment, wire bonding is not implemented for the electrical connection between the semiconductor chip 2 and the substrate 1. Specifically, the semiconductor chip 2 is soldered onto the substrate 1 through a plurality of metal balls 21, thereby electrically connecting the semiconductor chip 2 and the substrate 1. Moreover, as show in FIG. 14B, an underfill agent 22 is filled between the semiconductor chip 2 and the substrate 1, and the metal balls 21 are embedded in the underfill agent 22.

Fifteenth Embodiment

Figure 15:
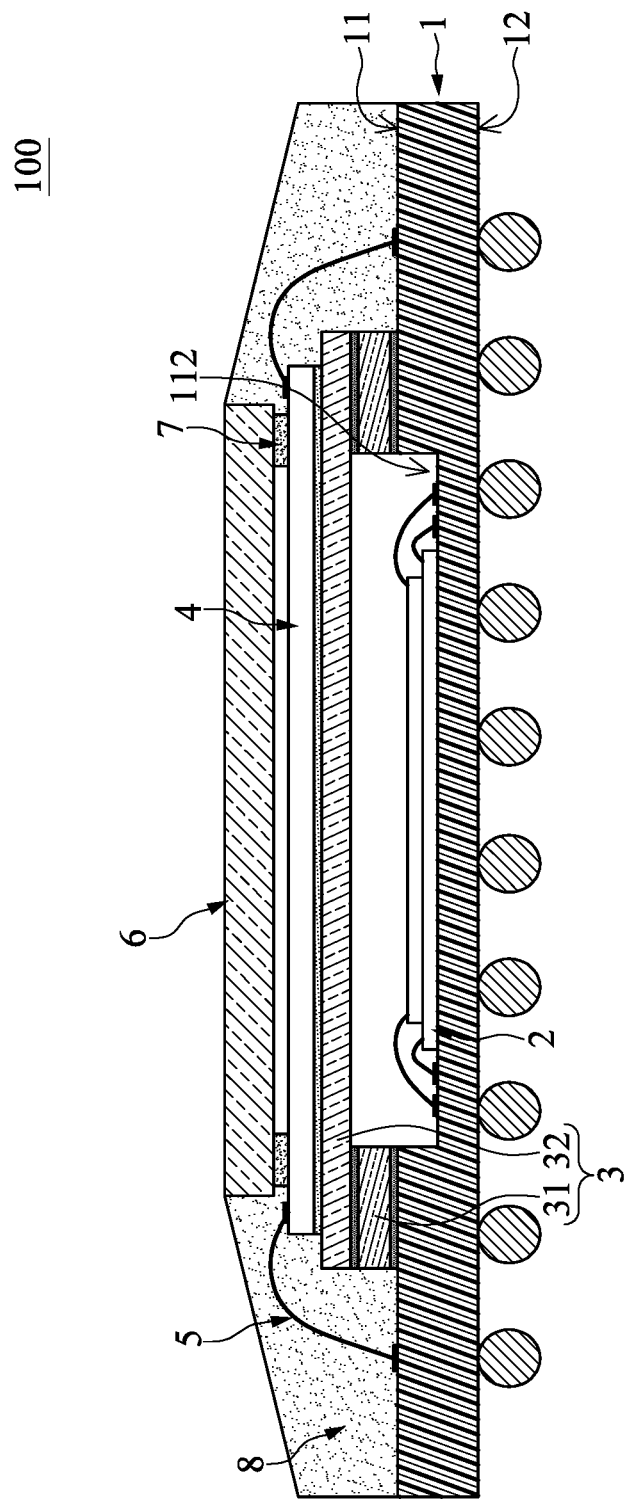
FIG. 15 is a cross-sectional view showing the stack type sensor package structure according to a fifteenth embodiment of the disclosure.

FIG. 15 illustrates a fifteenth embodiment of the disclosure, similar to the twelfth embodiment. The difference between the present embodiment and the twelfth embodiment is in structure of the substrate 1, as follows.

In the present embodiment, the substrate 1 is recessed from the upper surface 11 thereof to form an accommodating slot 112, and the semiconductor chips 2 are arranged in the accommodating slot 112. Each of the semiconductor chips 2 is connected to the bottom of the accommodating slot 112 by wire bonding, thereby electrically connecting each of the semiconductor chips 2 with the substrate 1.

Sixteenth Embodiment

Figure 16:
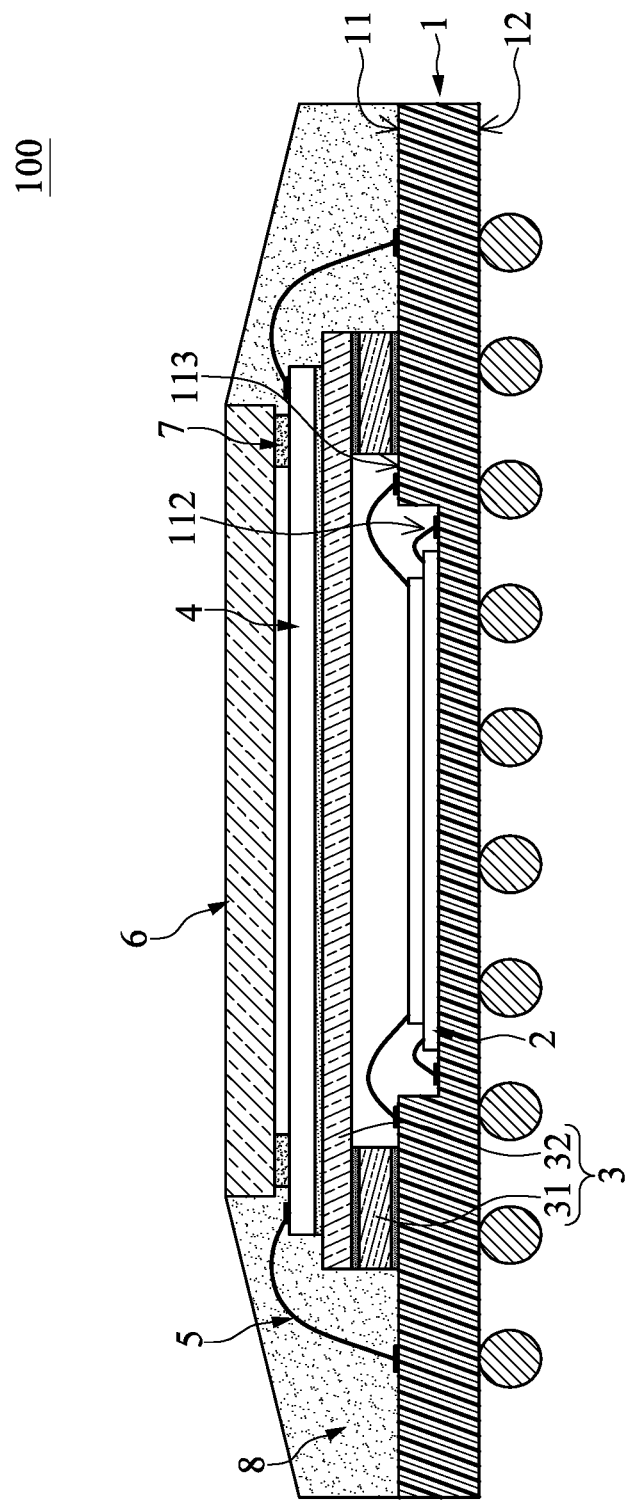
FIG. 16 is a cross-sectional view showing the stack type sensor package structure according to a sixteenth embodiment of the disclosure.

FIG. 16 illustrates a sixteenth embodiment of the disclosure, similar to the fifteenth embodiment. The difference between the present embodiment and the fifteenth embodiment is in the structure of the substrate 1, as follows.

In the present embodiment, the upper surface 11 of the substrate 1 has a wire bonding region 113 arranged between the frame 3 and the accommodating slot 112. At least one of the semiconductor chips 2 (i.e., the upper semiconductor chip 2 as shown in FIG. 16) is connected to the wire bonding region 113 of the substrate 1 by wire bonding, and the other semiconductor chip 2 (i.e., the lower semiconductor chip 2 as shown in FIG. 16) is connected to the bottom of the accommodating slot 112 of the substrate 1 by wire bonding, thereby electrically connecting each of the semiconductor chips 2 with the substrate 1.

Seventeenth Embodiment

Figure 17:
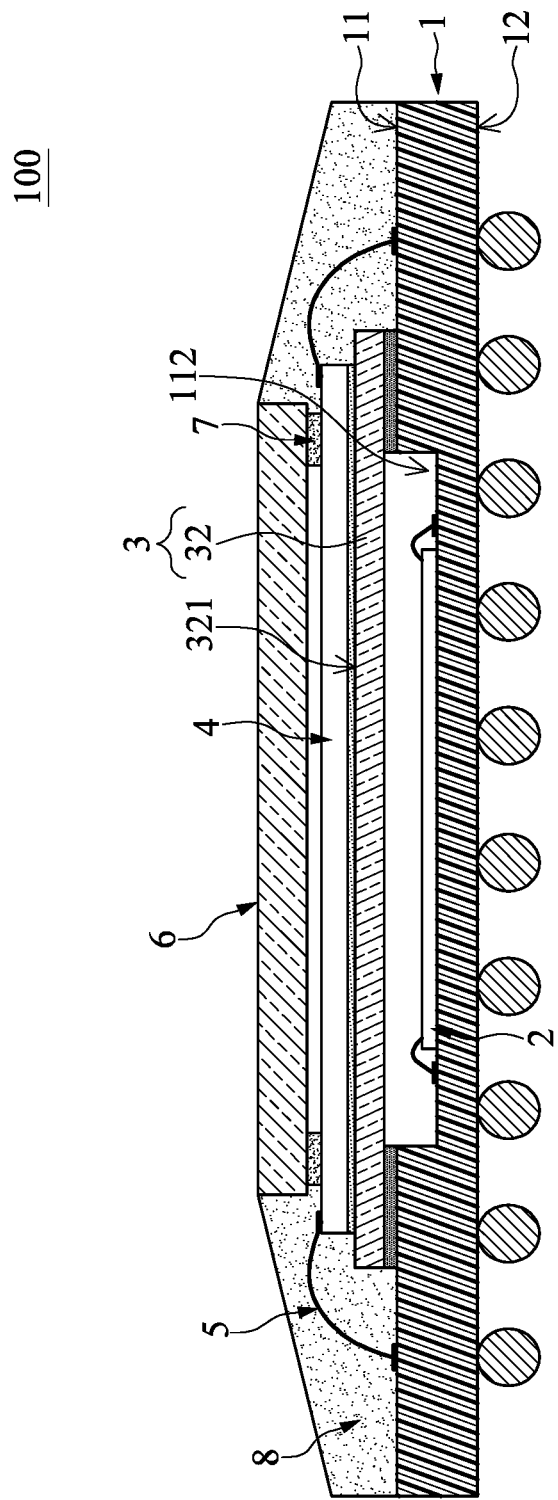
FIG. 17 is a cross-sectional view showing the stack type sensor package structure according to a seventeenth embodiment of the disclosure.

FIG. 17 illustrates a seventeenth embodiment of the disclosure, similar to the fifteenth embodiment. The difference between the present embodiment and the fifteenth embodiment is in the structure of the frame 3, and the difference is disclosed as follows.

In the present embodiment, the frame 3 is limited to a bearing plate 32 adhered to the upper surface 11 of the substrate 1, and an outer surface of the bearing plate 32 is defined as the bearing plane 321. The periphery of the bearing plate 32 can be connected to the upper surface 11 of the substrate 1 by an adhesive (not labeled), thereby sealing the accommodating slot 112. The adhesive can be a UV curing adhesive, a thermal curing adhesive, an adhesive mixture including a UV curing adhesive and a thermal curing adhesive, or an attach film, but the disclosure is not limited thereto.

Eighteenth Embodiment

Figure 18:
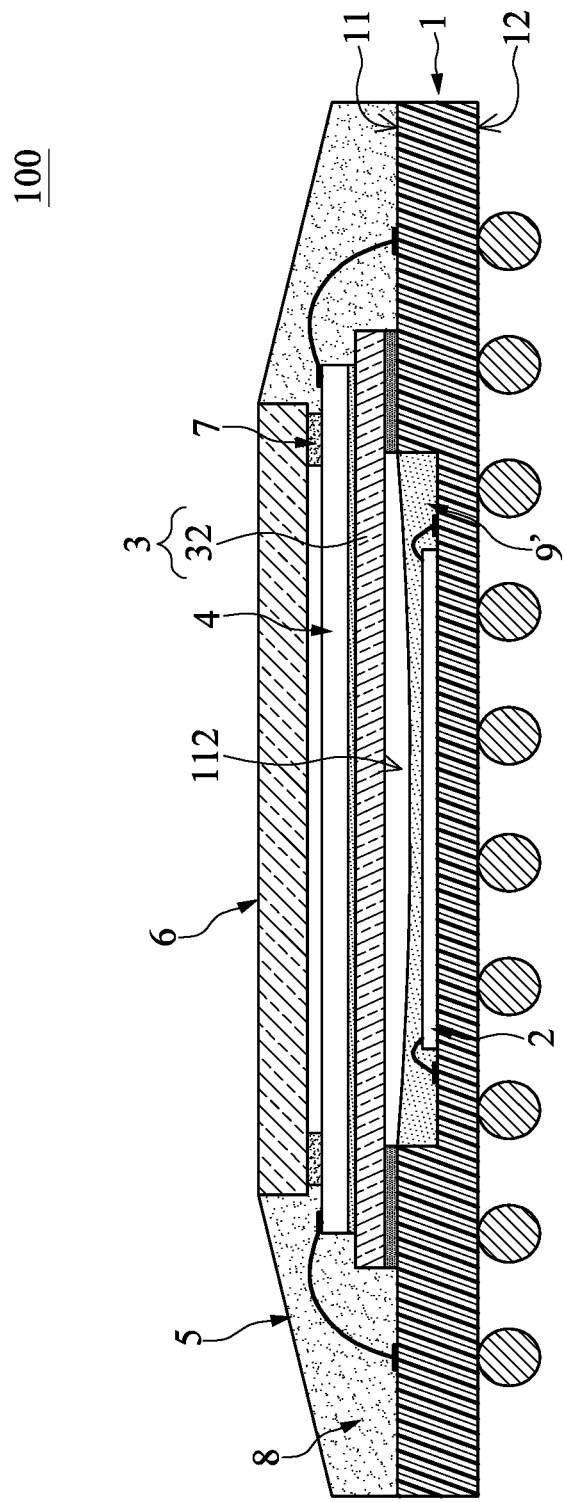
FIG. 18 is a cross-sectional view showing the stack type sensor package structure according to an eighteenth embodiment of the disclosure.

FIG. 18 illustrates an eighteenth embodiment of the disclosure, similar to the seventeenth embodiment. The difference between the present embodiment and the seventeenth embodiment is that the stack type sensor package structure 100 of the present embodiment further includes a sealant 9', as follows.

In the present embodiment, the accommodating slot 112 is filled with the sealant 9', wherein the semiconductor chip 2 is embedded in the sealant 9'.

Nineteenth Embodiment

Figure 19:
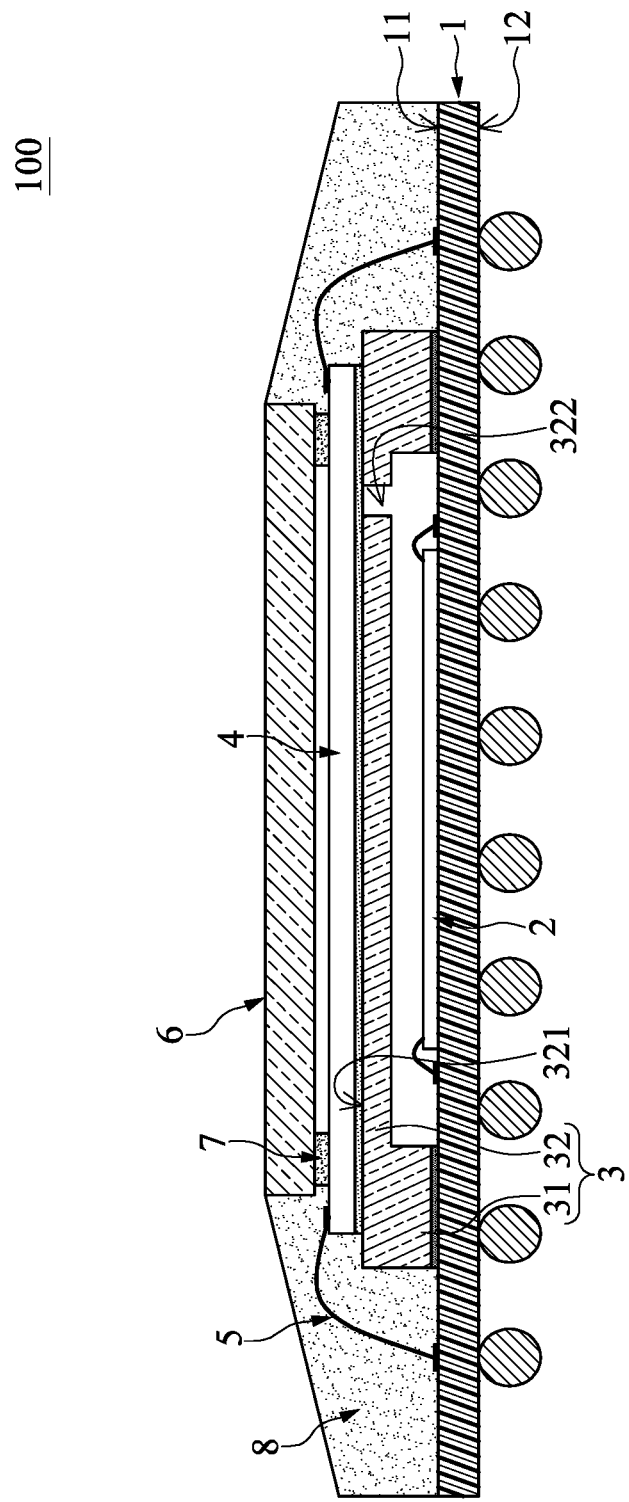
FIG. 19 is a cross-sectional view showing the stack type sensor package structure according to a nineteenth embodiment of the disclosure.

FIG. 19 illustrates a nineteenth embodiment of the disclosure, similar to the first embodiment. The difference between the present embodiment and the first embodiment is in the structure of the frame 3, as follows.

In the present embodiment, the bearing plate 32 of the frame 3 has a through hole 322, and the sensor chip 4 covers the through hole 322. The through hole 322 in the present embodiment is not located directly above the semiconductor chip 2, but the specific position of the through hole 322 formed in the frame 3 in the disclosure is not limited to the present embodiment. Accordingly, when the adhesive (not labeled) between the frame 3 and the substrate 1 is baked so as to fix the frame 3 onto the upper surface 11 of the substrate 1, air in the space between the frame 3 and the substrate 1 expands as it is heated and may exhaust through the through hole 322, thereby maintaining levelness of the bearing plane 321 of the frame 3.

Twentieth Embodiment

Figure 20:
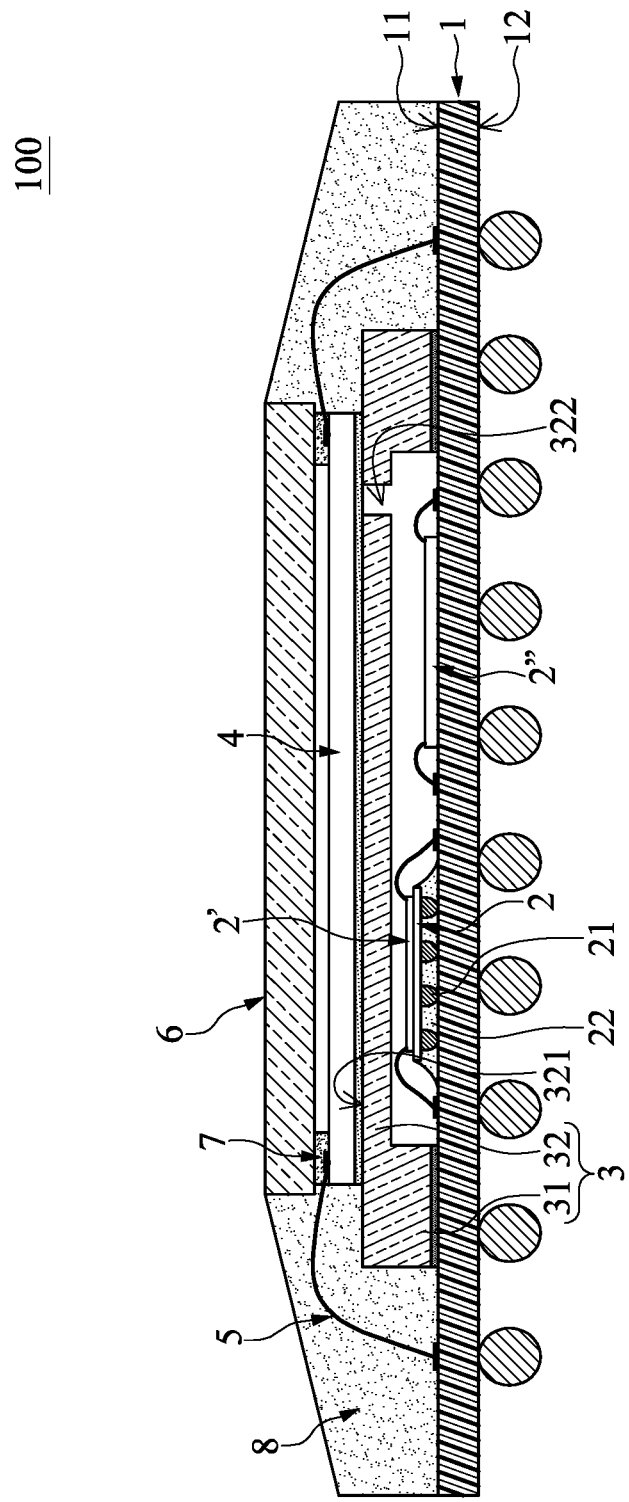
FIG. 20 is a cross-sectional view showing the stack type sensor package structure according to a twentieth embodiment of the disclosure.

FIG. 20, which illustrates a twentieth embodiment of the disclosure, similar to the nineteenth embodiment. The difference between the present embodiment and the nineteenth embodiment is that the stack type sensor package structure 100 of the present embodiment includes at least three semiconductor chips 2, 2', 2", as follows.

In the present embodiment, the three semiconductor chips 2, 2', 2" can be fixed in different manners and are respectively named as the first semiconductor chip 2, the second semiconductor chip 2', and the third semiconductor chip 2" for distinguishing among them. However, the terms "first", "second", and "third" do not have any technical meaning.

The first semiconductor chip 2 is soldered on the upper surface 11 of the substrate 1 through a plurality of metal balls 21, thereby electrically connecting the first semiconductor chip 2 and the substrate 1. Moreover, an underfill agent 22 is filled between the first semiconductor chip 2 and the substrate 1, and the metal balls 21 are embedded in the underfill agent 22.

The second semiconductor chip 2' is stacked on the first semiconductor chip 2, and is electrically connected to the upper surface 11 of the substrate 1 by wire bonding, thereby electrically connecting the second semiconductor chip 2' and the substrate 1.

The third semiconductor chip 2" is disposed on the upper surface 11 of the substrate 1 and is located beside the pile of the first and second semiconductor chips 2, 2'. The third semiconductor chip 2" is electrically connected to the upper surface 11 of the substrate 1 by wire bonding, thereby establishing an electrical connection between the third semiconductor chip 2" and the substrate 1.

It should be noted that the type of the first semiconductor chip 2, the second semiconductor chip 2', or the third semiconductor chip 2" can be determined according to design requirements. For example, the semiconductor chips 2, 2', 2" can be an image signal processor (ISP), a flash memory, or a micro controller.

The descriptions illustrated supra set forth simply the preferred embodiments of the disclosure; however, the characteristics of the disclosure are by no means restricted thereto. All changes, alterations, or modifications conveniently considered by those skilled in the art are deemed to be encompassed within the scope of the disclosure delineated by the following claims.

What is claimed is:

1. A stack type sensor package structure, comprising:
    a substrate having an upper surface and a lower surface opposite to the upper surface, wherein the substrate includes a plurality of solder pads arranged on the upper surface;
    at least one semiconductor chip mounted on the substrate;
    a frame fixed on the upper surface of the substrate and surrounded by the solder pads, wherein the at least one semiconductor chip is in a space defined by the frame and the substrate and does not contact the frame, and the frame has a bearing plane above the at least one semiconductor chip;
    a sensor chip having a top surface and a bottom surface opposite to the top surface, the sensor chip including a plurality of connecting pads arranged on the top surface thereof, wherein a size of the sensor chip is larger than that of the at least one semiconductor chip, and the bottom surface of the sensor chip is fixed on the bearing plane;
    a plurality of wires each having a first end and a second end opposite to the first end, wherein the first ends of the wires are respectively connected to the solder pads, and the second ends of the wires are respectively connected to the connecting pads;
    a transparent layer having a first surface and a second surface opposite to the first surface, wherein the second surface has a central region and a ring-shaped supported region encircling the central region;
    a support having a ring-shaped structure and disposed on at least one of the top surface of the sensor chip and the bearing surface of the frame, wherein a top end of the support abuts against the supported region of the transparent layer; and
    a package compound disposed on the upper surface of the substrate and covering a lateral side of the frame, at least part of a lateral side of the transparent layer, and a lateral side of the support, wherein at least part of each of the wires is embedded in the package compound,
    wherein the substrate is recessed from the upper surface thereof to form an accommodating slot, and the at least one semiconductor chip is arranged in the accommodating slot,
    wherein multiple semiconductor chips are included in the stack type sensor package structure, and the semiconductor chips are electrically connected to the substrate by wire bonding,
    wherein the upper surface of the substrate has a wire bonding region arranged between the frame and the accommodating slot, and at least one of the semiconductor chips is electrically connected to the wire bonding region of the substrate by wire bonding.

2. The stack type sensor package structure as claimed in claim 1, wherein the frame is recessed at an edge of the bearing plane to form a ring-shaped notch, and the ring-shaped notch is outside the sensor chip.

3. The stack type sensor package structure as claimed in claim 1, wherein at least part of the support is disposed on the top surface of the sensor chip, and covers the connecting pads and a part of each of the wires.

4. The stack type sensor package structure as claimed in claim 1, wherein an edge portion of the sensor chip does not include any connecting pads, and the support includes:
    a first supporting portion disposed on the top surface of the sensor chip and covering the connecting pads and a part of each of the wires; and
    a second supporting portion disposed on the bearing plane and arranged adjacent to the edge portion, wherein the second supporting portion does not contact any one of the wires,
    wherein a top end of the first supporting portion and a top end of the second supporting portion both abut against the supported region of the transparent layer.

5. The stack type sensor package structure as claimed in claim 1, wherein the top surface of the sensor chip has a sensing region, the connecting pads are arranged at a periphery of the sensing region, and the support is disposed on the top surface of the sensor chip and located between the sensing region and the connecting pads.

6. The stack type sensor package structure as claimed in claim 1, wherein the support is disposed on the bearing plane of the frame and located at a periphery of the sensor chip, and the support encompasses a part of each of the wires.

7. The stack type sensor package structure as claimed in claim 6, wherein the support includes:
    a supporting layer disposed on the bearing plane and located at the periphery of the sensor chip; and
    a connecting layer disposed on the supporting layer, wherein a top end of the connecting layer abuts against the supported region of the transparent layer.

8. The stack type sensor package structure as claimed in claim 7, wherein a height of the supporting layer relative to the bearing plane is substantially equal to a height of the top surface of the sensor chip relative to the bearing plane, the part of each of the wires is embedded in the connecting layer, and the supporting layer does not contact any one of the wires.

9. The stack type sensor package structure as claimed in claim 1, wherein the package compound is a molding compound, the package compound having a planar top surface lower than the first surface of the transparent layer by an overflow preventing distance about 50 μm to 100 μm.

10. The stack type sensor package structure as claimed in claim 1, wherein the package compound includes:
    a liquid compound covering the lateral side of the frame, the lateral side of the transparent layer, and the lateral side of the support, wherein the liquid compound has an oblique top surface, and an edge of the oblique top surface is connected to an edge of the transparent layer; and
    a molding compound formed on the oblique top surface of the liquid compound, the molding compound has a top surface parallel to the first surface of the transparent layer, and the top surface of the molding compound is lower than the first surface of the transparent layer by an overflow preventing distance about 50 µm to 100 µm.

11. The stack type sensor package structure as claimed in claim 1, further comprising at least one embedded chip embedded in the substrate.

12. The stack type sensor package structure as claimed in claim 1, wherein the frame includes:
a ring-shaped base fixed on the substrate; and
a bearing plate connected to the ring-shaped base, wherein an outer surface of the bearing plate is defined as the bearing plane.

13. The stack type sensor package structure as claimed in claim 12, wherein the bearing plate has a through hole, and the sensor chip shields the through hole.

14. The stack type sensor package structure as claimed in claim 12, wherein the space defined by the frame and the substrate is filled with air.

15. The stack type sensor package structure as claimed in claim 12, further comprising a sealant filling the space defined by the frame and the substrate, wherein the at least one semiconductor chip is embedded in the sealant.

16. The stack type sensor package structure as claimed in claim 1, wherein the at least one semiconductor chip is soldered onto the substrate through a plurality of metal balls, an underfill agent is filled between the at least one semiconductor chip and the substrate, and the metal balls are embedded in the underfill agent.

17. The stack type sensor package structure as claimed in claim 1, further comprising a plurality of solder balls arranged in an array and fixed to the lower surface of the substrate.

18. A stack type sensor package structure, comprising:
a substrate having an upper surface and a lower surface opposite to the upper surface, wherein the substrate includes a plurality of solder pads arranged on the upper surface;
at least one semiconductor chip mounted on the substrate;
a frame fixed on the upper surface of the substrate and surrounded by the solder pads, wherein the at least one semiconductor chip is in a space defined by the frame and the substrate and does not contact the frame, and the frame has a bearing plane above the at least one semiconductor chip;
a sensor chip having a top surface and a bottom surface opposite to the top surface, the sensor chip including a plurality of connecting pads arranged on the top surface thereof, wherein a size of the sensor chip is larger than that of the at least one semiconductor chip, and the bottom surface of the sensor chip is fixed on the bearing plane;
a plurality of wires each having a first end and a second end opposite to the first end, wherein the first ends of the wires are respectively connected to the solder pads, and the second ends of the wires are respectively connected to the connecting pads;
a transparent layer having a first surface and a second surface opposite to the first surface, wherein the second surface has a central region and a ring-shaped supported region encircling the central region;
a support having a ring-shaped structure and disposed on at least one of the top surface of the sensor chip and the bearing surface of the frame, wherein a top end of the support abuts against the supported region of the transparent layer; and
a package compound disposed on the upper surface of the substrate and covering a lateral side of the frame, at least part of a lateral side of the transparent layer, and a lateral side of the support, wherein at least part of each of the wires is embedded in the package compound,
wherein an edge portion of the sensor chip does not include any connecting pads, and the support includes:
a first supporting portion disposed on the top surface of the sensor chip and covering the connecting pads and a part of each of the wires; and
a second supporting portion disposed on the bearing plane and arranged adjacent to the edge portion, wherein the second supporting portion does not contact any one of the wires,
wherein a top end of the first supporting portion and a top end of the second supporting portion both abut against the supported region of the transparent layer.

19. The stack type sensor package structure as claimed in claim 18, wherein the substrate is recessed from the upper surface thereof to form an accommodating slot, and the at least one semiconductor chip is arranged in the accommodating slot.

20. The stack type sensor package structure as claimed in claim 19, further comprising a sealant filling the accommodating slot, wherein the at least one semiconductor chip is embedded in the sealant.

21. The stack type sensor package structure as claimed in claim 19, wherein the frame is a bearing plate adhered to the upper surface of the substrate, and an outer surface of the bearing plate is defined as the bearing plane.

22. A stack type sensor package structure, comprising:
a substrate having an upper surface and a lower surface opposite to the upper surface, wherein the substrate includes a plurality of solder pads arranged on the upper surface;
at least one semiconductor chip mounted on the substrate;
a frame fixed on the upper surface of the substrate and surrounded by the solder pads, wherein the at least one semiconductor chip is in a space defined by the frame and the substrate and does not contact the frame, and the frame has a bearing plane above the at least one semiconductor chip;
a sensor chip having a top surface and a bottom surface opposite to the top surface, the sensor chip including a plurality of connecting pads arranged on the top surface thereof, wherein a size of the sensor chip is larger than that of the at least one semiconductor chip, and the bottom surface of the sensor chip is fixed on the bearing plane;
a plurality of wires each having a first end and a second end opposite to the first end, wherein the first ends of the wires are respectively connected to the solder pads, and the second ends of the wires are respectively connected to the connecting pads;
a transparent layer having a first surface and a second surface opposite to the first surface, wherein the second surface has a central region and a ring-shaped supported region encircling the central region;
a support having a ring-shaped structure and disposed on at least one of the top surface of the sensor chip and the bearing surface of the frame, wherein a top end of the support abuts against the supported region of the transparent layer; and
a package compound disposed on the upper surface of the substrate and covering a lateral side of the frame, at least part of a lateral side of the transparent layer, and a lateral side of the support, wherein at least part of each of the wires is embedded in the package compound, wherein the support is disposed on the bearing plane of the frame and located at a periphery of the sensor chip, and the support encompasses a part of each of the wires, wherein the support includes:

a supporting layer disposed on the bearing plane and located at the periphery of the sensor chip; and a connecting layer disposed on the supporting layer, wherein a top end of the connecting layer abuts against the supported region of the transparent layer, wherein a height of the supporting layer relative to the bearing plane is substantially equal to a height of the top surface of the sensor chip relative to the bearing plane, the part of each of the wires is embedded in the connecting layer, and the supporting layer does not contact any one of the wires.

* * * * *